United States Patent [19]

Hendrickson et al.

[11] 4,256,979
[45] Mar. 17, 1981

[54] ALTERNATING POLARITY POWER SUPPLY CONTROL APPARATUS

[75] Inventors: Thomas E. Hendrickson, Wayzata; Thomas C. Spindler, Coon Rapids, both of Minn.

[73] Assignee: Honeywell, Inc., Minneapolis, Minn.

[21] Appl. No.: 973,463

[22] Filed: Dec. 26, 1978

[51] Int. Cl.³ .................... H03K 17/60; H01L 29/72
[52] U.S. Cl. .................................. 307/571; 307/279; 307/304
[58] Field of Search ............... 367/251, 279, 268, 304, 367/254; 357/22, 23

[56] References Cited

U.S. PATENT DOCUMENTS

| | | | |
|---|---|---|---|
| 3,112,410 | 11/1963 | Schmid .................................. | 307/254 |
| 3,131,312 | 4/1964 | Putzrath ................................ | 307/251 |
| 3,311,756 | 3/1967 | Nagata et al. ........................ | 307/251 |
| 3,348,062 | 10/1967 | Carlson et al. ....................... | 307/251 |
| 4,148,046 | 4/1979 | Hendrickson et al. ................ | 357/22 |
| 4,148,047 | 4/1979 | Hendrickson et al. ................ | 357/23 |
| 4,152,714 | 5/1979 | Hendrickson et al. ................ | 357/22 |

*Primary Examiner*—Stanley D. Miller, Jr.
*Assistant Examiner*—B. P. Davis
*Attorney, Agent, or Firm*—Theodore F. Neils

[57] ABSTRACT

An electronic switching circuit is provided for controlling transfer of electrical power from an alternating polarity electrical power supply to a load means through use of a field-effect transistor device as the primary power controlling element.

60 Claims, 7 Drawing Figures

ALTERNATING POLARITY POWER SUPPLY CONTROL APPARATUS

Reference is hereby made to copending application by B. H. Pinkaers entitled "Alternating Polarity Power Supply Control Apparatus" having Ser. No. 973,215, and by T. E. Hendrickson entitled "Alternating Polarity Power Supply Control Apparatus" having Ser. No. 973,216, which were all filed on even date with the present application and which were all assigned to the same assignee as the present application. Reference is also made to earlier filed copending applications, all assigned to the same assignee, by T. E. Hendrickson entitled "Semicondcutor Apparatus" having Ser. No. 869,981, by T. E. Hendrickson, et al., entitled "Semiconductor Apparatus" having Ser. No. 869,980, and by T. E. Hendrickson, et. al., entitled "Semiconductor Apparatus" having Ser. No. 869,977.

BACKGROUND OF THE INVENTION

The present invention is related to circuits in which a field-effect transistor device controls power transfer from an alternating polarity electrical power supply to a load means, particularly when such field-effect transistor devices are capable of being integrated in monolithic integrated circuits.

Various solid state devices have been used in circuits as the primary means for controlling power transfer from an alternating polarity electrical power supply to whatever kind of load means is of interest for use in the circuit. For instance, planar bipolar power transistors have been used but these are devices which are not bidirectional by nature and which exhibit an inherent, more or less irreducible, minimum power dissipation characteristic even when fully switched on. And to be switched fully on, bipolar power transistors require a substantial amount of base current, i.e., control current, especially for higher collector, or load, currents. Furthermore, they are also subject by nature to thermal runaway.

Perhaps more commonly used for controlling alternating polarity power supplies are thyristors of various kinds such as silicon controlled rectifiers and triacs. Such thyristors are switching devices primarily used in alternating polarity power supply control circuits because of their capability for handling relatively large power dissipations when switched fully on, and for withstanding substantially reversed voltages when switched fully off. An advantage of these devices over bipolar power transistors is that they require little electrical power at device control gates whether operating in the off condition or in the on condition.

However, such thyristors also have several disadvantages such as being a latching switch, that is, operating only in fully on or fully off states. Further, thyristor devices can be switched off by sufficiently reducing the current therethrough, and can be switched on by sharp voltage transients thereacross—both results being obtained without any action taking place at the control terminal of the thyristor device. Hence, the control terminal of the thyristor has relatively little continuous control capability. This same control terminal, in many situations, cannot be electrically isolated simply and inexpensively from the load circuit and may require a large triggering current to switch on the thyristor device. Finally, a thyristor device cannot be easily provided in a monolithic integrated circuit with other circuit components because of its structure and power dissipation.

Hence, better primary power controlling devices are desired for use in controlling power transfer from alternating polarity electrical power supplies and alternating polarity operated circuits. Particularly useful would be a device which could be easily provided in a monolithic integrated circuit along with other circuit components, at least some of which would also be used in controlling power transfer from the alternating polarity power supply used. This will require that such a device not have too large a resistance if switched fully on, despite substantial current loads, but which would have a structure easily fabricated in such an integrated circuit. Further, the device should have a bidirectional current conduction capability for circuits in which current rectification is not desired.

Field-effect transistor devices can have many of the characteristics just described, including having a very symmetrical bidirectional current conducting capability when on. This is certainly so for metal-oxide-semiconductor field-effect transistor (MOSFET) devices which have the advantage of having the gates therein very well isolated from the channel regions of the device. This isolation aids in providing a circuit to operate the field-effect transistor device when both the circuit and these devices are formed in a monolithic integrated circuit chip, a difficult arrangement when the integrated circuit is to operate with an alternating polarity power supply. Such circuits must permit the operation of other circuit component devices in the monolithic integrated circuit while also controlling power transfers from the alternating polarity power supply through operating the primary power transfer control field-effect device.

Electronic component device theory shows that field-effect transistors are operated by controlling the voltage appearing between the gate thereof and the connection to that one of the two channel regions therein which is effectively serving as the transistor source. Difficulties arise in those circuits using a field-effect transistor to control power transfers from an alternating polarity power supply because the two connections to the channel region of such a transistor serve alternately as the source rather than one of them serving continually as the source.

Certain field-effect transistor structures are especially useful for providing a field-effect transistor capable of controlling power transfer from an alternating polarity power supply to a load means. Such transistors should have low channel resistance when operated fully on—on the order of tenths of ohms—if they are to be successfully used in a monolithic integrated circuit. Then these transistors, when passing several amps of current, will not cause the circuit to suffer heat dissipation sufficient to disrupt the operation of other circuit components. Further, this channel resistance in a fully turned on device should be more or less symmetrical so there are no current rectification effects occurring. And, of course, the transistor device structure should be capable, when switched off, of withstanding, without breakdown, voltages at least as large as the peak voltage provided by the alternating polarity supply used. In this regard, the applications referenced above entitled "Semiconductor Apparatus" teach various devices, effectively field-effect transistors, which exhibit one or more of these desired characteristics.

The application referenced above entitled "Alternating Polarity Power Supply Control Apparatus" by Hendrickson shows several circuits making use of such a field-effect transistor to control power transfer from an alternating polarity electrical power supply to a load means. One of these circuits is shown in FIG. 1 of the present application. This circuit operates using an enhancement mode, p-channel, MOSFET, 10, for controlling power transfers from an alternating polarity electrical power supply, 11, to a load means, 12, or alternatively, to a selected one of three other load means, 30, 31, or 32 provided at other locations in the circuit (these alternative loads are shown by dashed lines). As the above-referenced Hendrickson application indicates, there are several other essentially equivalent circuit versions of the circuit of FIG. 1 indicated therein using other kinds of electronic components, as well as some entirely different circuits.

An advantage of the circuit shown in FIG. 1 herein is that the circuitry for controlling power transfers through transistor 10 from supply 11 to load means 12 can be operated from electrical power supplied solely by alternating power supply 11. That is, a control switch means, 33, is shown for operating transistor 10 where control switch means 33 can be operated solely from voltage developed across a capacitor, 27, derived ultimately from supply 11.

Of particular note in FIG. 1 of the present application is the explicit showing therein of the effecitve, but parasitic, circuit components inherent in transistor 10 which are presented in equivalent "lumped" form, all of these being present as a result of the actual physical structure of transistor 10. Of course, every transistor physical structure leads to having, effectively, parasitic circuit components associated therewith. However, such parasitic components are more likely to be significant in value for a power control transistor, such as transistor 10, compared to a signal control transistor because the power transistor is usually of a relatively large physical size when compared to transistors used for controlling signals only. Thus, the parasitic components are explicitly shown with transistor 10 only in FIG. 1 even though such parasitic components are also associated with the structures of the other transistors shown in FIG. 1. The assumption is that these other transistors have associated parasitics that will have a relatively insignificant effect on circuit operation.

Field-effect transistor 10, being a p-channel MOSFET, is provided in a substrate material of n-type conductivity. The channel connection regions, 15 and 16, which terminate the ends of the channel region in transistor 10 and can serve as source and drain regions therein, are formed by diffusion or implantation of p-type conductivity impurities into the substrate material. Parasitic diodes are formed in the structure of transistor 10 by the semiconductor pn junctions occurring between regions 15 and 16, on the one hand, and the substrate of transistor 10 on the other. These diodes are designated 17 and 18 in FIG. 1.

Also associated with these pn junctions are parasitic capacitances, 19 and 20, and parasitic resistances 21 and 22. Further parasitic capacitances present are a channel-to-substrate capacitance, 23, and a gate-to-channel capacitance, 24. Two other parasitic capacitances, 25 and 26, are shown which are each effective between gate 14 and one of the channel terminating regions 15 or 16. All of these parasitic components will have more or less of an effect on the operating behavior of transistor 10, and so in the behavior of the circuit in which transistor 10 is provided. The significance of these effects depends on the conditions existing in such a circuit. Of course, capacitance 24 is essential for switching on transistor 10 by forming a channel, yet this capacitance and the other parasitic components shown with transistor 10 are normally desired to contribute as insignificantly as possible to the circuit operation.

At sufficiently low frequencies, the parasitic capacitances shown in connection with transistor 10 in FIG. 1 will not be significant factors in the operation of the circuit of this figure. Also, the leakage resistances 21 and 22 of FIG. 1 are usually sufficiently large so that they will not be significant in the operation of this circuit.

Further, note that load means 12 could also have a reactance component thereto but has been shown and will be described as being resistive for ease of understanding and exposition. This is also true of the alternative to load means 12, that is load means 30, 31, and 32. The alternative uses of these load means in the circuit of FIG. 1 are described in the above-referenced Hendrickson application entitled "Alternating Power Supply Control Apparatus".

The two enhancement mode, p-channel, metal-oxide-semiconductor field-effect transistors (MOSFET'S), 28 and 29, connected across alternating polarity power supply 11 are connected to operate as diodes. In operating in this manner, transistor 28 appears to be a diode having its cathode connected to alternating polarity power supply 11 and an anode connected to an energy storage capacitor, 27. The same description fits transistor 29. As indicated in the above-referenced Hendrickson application entitled "Alternating Power Supply Control Apparatus", the primary power transfer control transistor 10 and the signal controlled enhancement mode, p-channel MOSFETS, 34 and 35, along with transistors 28 and 29 (depending on which of loads 12, 30, 31 and 32 are actually used) can each have its substrate connection electrically connected in common with each of the other transistors as would occur if they were jointly formed in a single monolithic integrated circuit chip. This is not necessarily true for the substrate connection for transistors 28 and 29 for certain choices in selecting one of loads, 12, 30, 31 and 32.

The sole source of power used to operate the circuit of FIG. 1 is alternating polarity power supply 11. Supply 11 not only provides power for controlled transfer to load means 12 (the load chosen for purposes of the following description of FIG. 1), upon being selected to do so by appropriately activating switch means 33, but also provides power to be stored in capacitor 27 to operate circuitry of switching means 33 and perhaps other circuits. Of course a separate power supply means could be used in place of capacitance 27, and this must be done to use a depletion mode device in place of the enhancement mode transistor 10 as described in the Hendrickson application referenced above entitled "Alternating Polarity Power Supply Control Apparatus". In the arrangement of FIG. 1, with constant polarity voltage being supplied to switch means 33 from across capacitor 27, transistors 34 and 35 and the associated switch control circuitry, 36, are all electrically energized by the stored electrical energy provided in capacitor 27. In operation, switch means 33 has either transistor 34 on and transistor 35 off, or vice versa, as determined by switch control circuitry 36, and so these transistors together operate in series as a single pole, double throw switch.

In the situation where transistor 34 is switched on while transistor 35 is switched off—thereby effectively shorting the gate region, 14, of transistor 10 to the substrate connection, 13, of transistor 10—supply means 11 will charge capacitance 27. When the side of supply 11 not connected to load means 12 is positive, the charging current will flow through channel terminating region 16, parasitic diode 18, capacitance 27 and transistor 28 serving as a diode thereby charging capacitance 27. When supply 11 changes polarity, a charging current will flow through terminating region 15 of transistor 10, parasitic diode 17, capacitance 27 and transistor 29 serving as a diode.

Note further, there will be little discharging of capacitor 27 as supply 11 output voltage polarity changes (depending on how switching control circuitry 33 is implemented). This is because of the reverse biased nature of all of the diodes, including the parasitic ones, between the positive side of capacitance 27 and the negative side thereof as shown in FIG. 1.

In this situation, transistor 10 will be held fully off because of the effective short occurring between gate region 14 and substrate connection 13 through transistor 34. Gate 14 will follow the substrate which will also be within a voltage drop across one of the parasitic diodes 17 or 18 of the positive side of supply 11. Thus, the threshold voltage of transistor 10 will never be exceeded by the voltage occurring between gate region 14 and whichever the terminating region 15 or 16 is positive with respect to the other. Device theory indicates in these circumstances that the transistor 10 will be off.

However, if the control situation is reversed and transistor 35 is switched fully on with transistor 34 being switched off to thereby effectively short the negative side of capacitor 27 to gate region 14, transistor 10 will be switched fully on. This occurs because in these circumstances gate region 14 is held negative with respect to the substrate by the voltage appearing across capacitor 27. Yet, the substrate is still always within a diode voltage drop of the positive voltage value appearing on one side of transistor 10 or the other, i.e., one of terminating regions 15 or 16, through parasitic diodes 17 and 18 (excluding any circuit transients in this consideration). As a result, the gate of transistor 10 is held negative with respect to whichever of channel terminating regions 15 and 16 is positive, that region being, device theory indicates, the channel terminating region then serving as the transistor 10 source. Thus, for sufficient voltage across capacitor 27, device theory indicates that transistor 10 will be on.

The preceding circuit operation description made no mention of the parasitic capacitances associated with transistor 10 on the assumption of sufficiently low frequency operation of supply 11.

However, for sufficiently high frequencies of polarity alternation in the output voltage of alternating polarity power supply means 11, the operation just described will no longer be accurate. This is primarily because of the presence of these parasitic capacitances associated with transistor 10 as shown in FIG. 1.

At least three detrimental circuit operation effects of possible significance can occur because of the presence of these parasitic capacitances. First, the charging of parasitic capacitances 19 and 20, and capacitance 27, with transistor 10 off can lead to bipolar transistor action between terminating regions 15 and 16 in the form of an effective pnp transistor which would tend to provide a more or less conductive pathway between terminating regions 15 and 16 which are intended to be electrically isolated from one another in these circumstances. Second, the charge on these parasitic capacitances may lead to delays in the intended operation of transistor 10 because of the charge in the parasitic capacitors tending to maintain earlier existing conditions about transistor 10 until these parasitic capacitors have been discharged. This can lead to transistor 10 responding slowly, incompletely or not at all to the electrical signals supplied intended to control this transistor.

Finally, the charging of the parasitic capacitors leads to a voltage thereacross which can add to the voltage being provided by alternating power supply 11 as it changes polarity. This situation can either cause transistor 10 to breakdown or will require the breakdown voltages associated with transistor 10 to be approximately twice as large as the peak voltage being supplied by alternating polarity power supply 11.

These undesirable effects are likely to be encountered with the use of a large physical size transistor as is usually necessary for controlling transfer of substantial amounts of power from alternating polarity supply 11 to a load means in many kinds of power transfer control circuits. Thus, means for eliminating these parasitic effects are desirable features in circuits having field-effect transistor devices used for controlling substantial transfers of power to load means from alternating polarity power supplies having sufficiently high frequencies of polarity alternation. A further desirable feature would be accomplishing this in a circuit which permits providing constant polarity power to other circuit components, including auxiliary control components used in controlling the primary transfer control field-effect transistor device, and yet requires only the presence of the alternating polarity power supply as the single electrical power source.

SUMMARY OF THE INVENTION

The invention provides a circuit with a field-effect transistor device which can be used in controlling power transfers between an alternating polarity power supply and a load means, with the supply and load, in operation, connected on either side of the device channel. In one form, there is effectively provided bypass means connected on either side of the device channel and to the substrate of the device. In another form, such bypass means can be connected between the substrate or either end of the device channel and the gate region. Both of these forms can be combined for use with one such field-effect transistor device. Either or both of these forms, used with such a field-effect transistor device, can also be used in circuits in which the only power supply present is the alternating polarity power supply for providing power both to the load and to other circuit components which operate with constant polarity electrical power.

DESCRIPTION OF THE PREFERRED EMBODIMENTS

Figure 1:
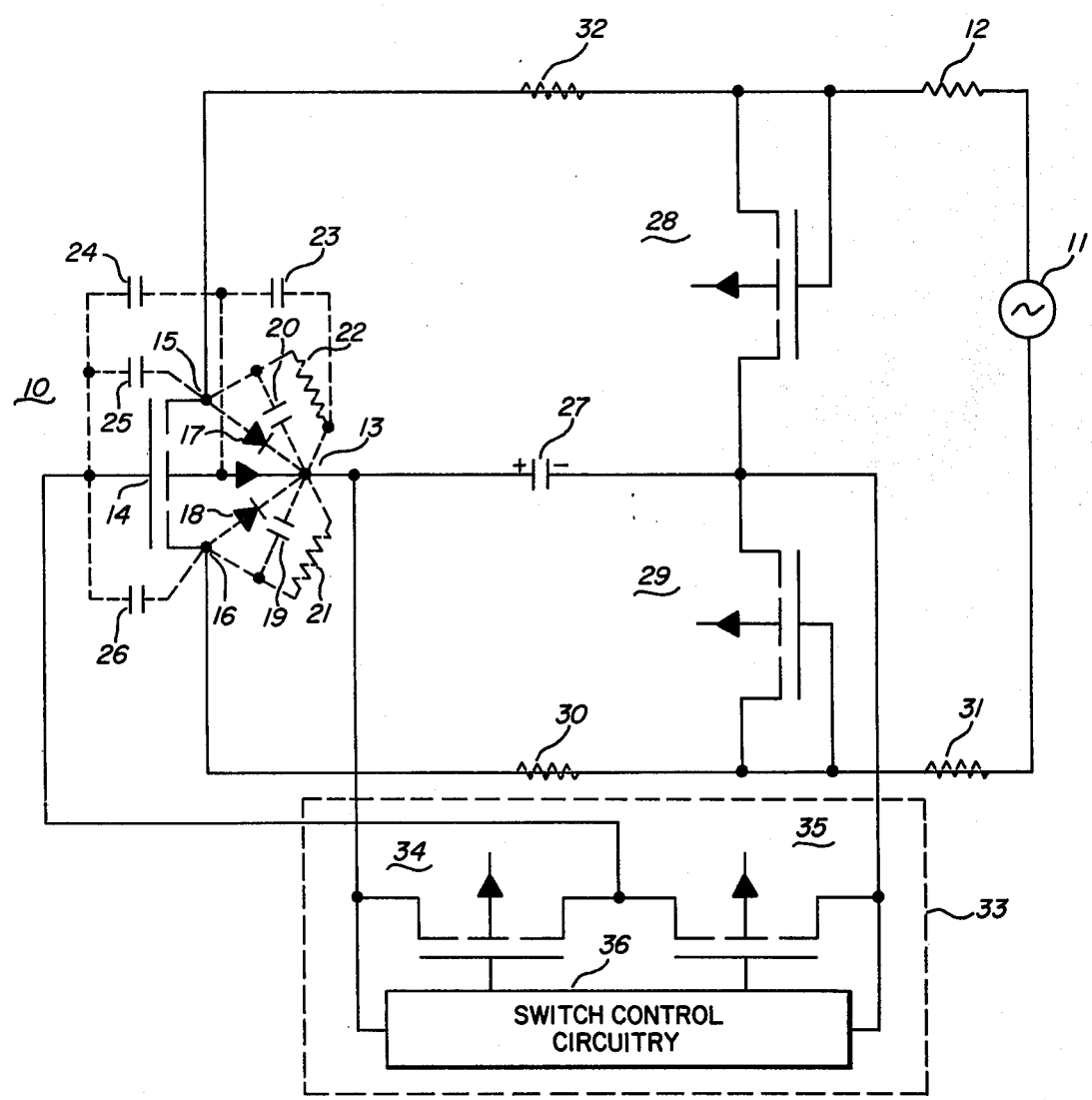
FIG. 1 shows a kind of circuit for controlling power transfers from an alternating polarity electrical power supply to a load means.
Figure 2:
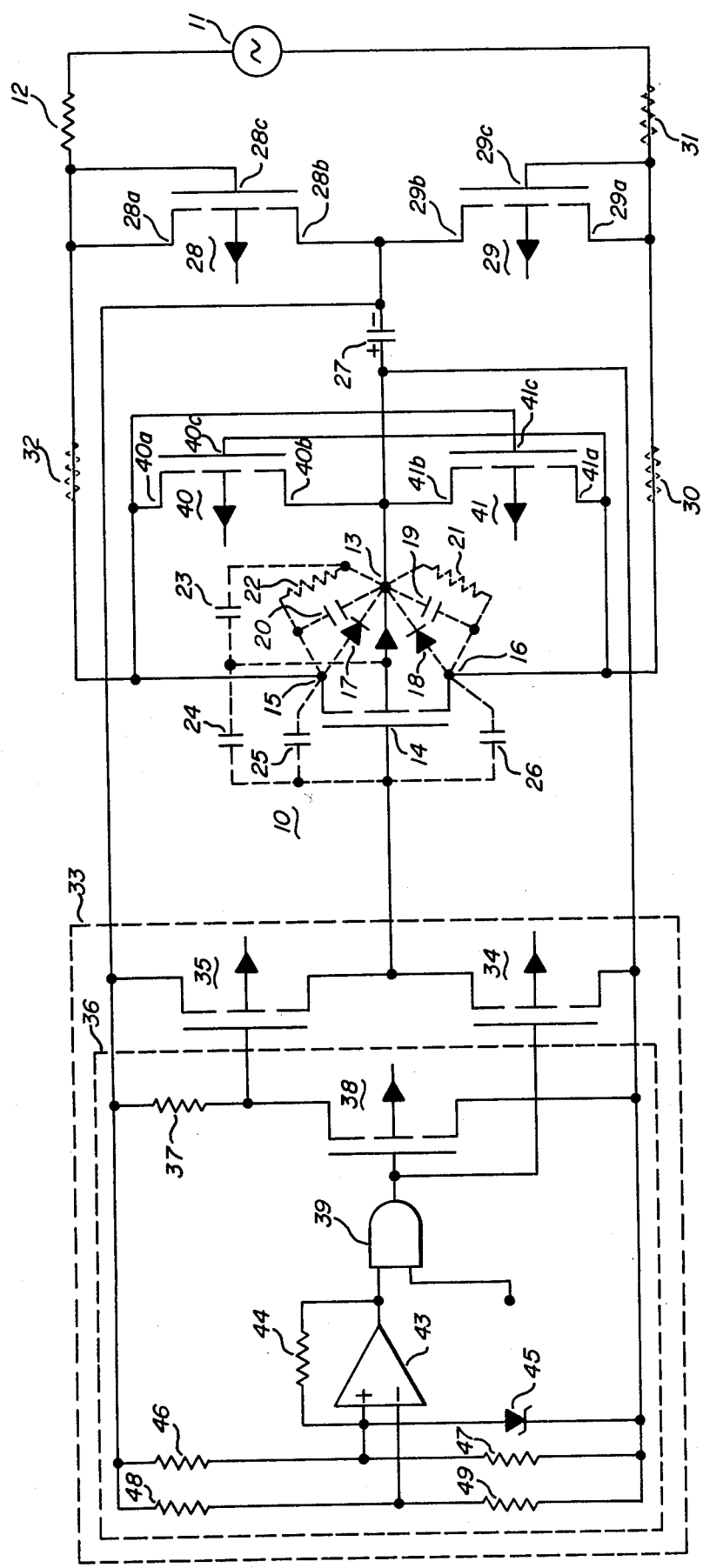
FIG. 2 shows a first embodiment of the circuit of the invention to be used for the same purpose.

FIG. 2 shows an improved version of the circuit of FIG. 1 as well as presenting a more detailed showing of control switch means 33 of that figure. The same designations have been retained in FIG. 3 as were used for corresponding components in FIG. 2.

In FIG. 2, alternating polarity voltage supply 11 in series with load 12 is again provided on either side of transistor 10, this series combination being connected to terminating region 15 on one side and to terminating region 16 on the other side. Similarly, electrical energy storage capacitance 27 is connected from the substrate junction 13 of transistor 10 to the common junction of terminating regions 28b and 29b of the series combination of transistors 28 and 29, respectively, this series combination being provided in parallel across supply 11 and load means 12. Again, alternative locations for load means 12 are shown by dashed line loads 30, 31 and 32. Any of these load means shown could also have a reactive component but are shown as being resistive for ease of understanding and exposition. All of the parasitic circuit elements shown associated with transistor 10 in FIG. 1 are again shown associated with transistor 10 in FIG. 2 and again are provided in dashed line circuits to indicate the elements are parasitic.

In control switch means 33, there is shown how a single signal element can control both transistors 34 and 35 to effectuate the control of transistor 10. That is, a resistor, 37, and an enhancement mode, p-channel, MOSFET, 38, are controlled by an AND logic gate, 39, and provide an inversion of the output signal of gate 39 for operating transistor 35. This is in accord with transistor 35 being off when transistor 34 is on, and vice versa, since logic gate 39 operates transistor 34 directly with no such gate output signal inversion.

Logic gate 39 is shown with two inputs, although there may well be more in a particular application of the circuit, with one of the inputs shown being unconnected and intended for receiving an external signal provided by the user of the circuit. The other input shown is connected to further circuit components which are used to verify that a sufficient voltage appears on capacitance 27 to operate control switch means 33, this function and the associated circuit components to be discussed below. Of course, other kinds of circuit components could be used in switch control means 33 such as bipolar transistors or even mechanical switches to achieve the same control functions though in probably different circuits.

The addition for improving the circuit of FIG. 2, over the circuit shown in FIG. 1, for use at higher frequencies involves primarily the provision of a pair of bypass transistors, 40 and 41. These transistors are used to selectively shunt those parasitic components associated with transistor 10 which are connected between terminating regions 15 and 16 thereof, on the one hand, and substrate connection 13 on the other. As a result, these transistors can also supply the charging current to capacitance 27 to eliminate any bipolar action between terminating regions 15 and 16 of transistor 10. Transistor 40 has one of its terminating regions, 40a, connected to terminating region 15 of transistor 10 as is the gate region, 41c, of transistor 41. Similarly, one of the terminating regions, 41a, of transistor 41 is connected to terminating region 16 of transistor 10 as is gate region, 40c, of transistor 40. The other terminating region, 40b, of transistor 40 and the other terminating region, 41b, of transistor 41 are each connected to substrate connection 13 of transistor 10.

In operation, consider first the situation where the inputs to logic gate 39 are such that the output of logic 39 is in the low state, or approximately at the voltage occurring in the negative side of capacitor 27. This voltage is thereby provided at the gates of transistors 34 and 38, leading to both of these transistors being on. This is because the resulting gate voltage on each will be more negative than the voltage provided at the source connections of these transistors respectively, the connections of each to the positive side of capacitor 27. On the other hand, transistor 38 will effectively short the gate of transistor 35 to the voltage appearing on the positive side of transistor 27. This will lead to transistor 35 being switched off since the gate voltage thereon will be very near the source voltage of transistor 35 set by transistor 34 effectively shorting the source thereof to the positive side of capacitor 27.

With transistor 34 switched fully on, there will be in effect a short between gate region 14 of transistor 10 and the substrate connection 13 thereof. In this situation, gate region 14 follows the voltage on whichever of terminating regions 15 or 16 of transistor 10 is serving as the source as will be shown below. Under these circumstances, device theory indicates that transistor 10 will be switched off because the voltage between the gate region 14 thereof and whichever of terminating regions 15 or 16 thereof is serving as the source will not exceed the threshold voltage required to switch transistor 10 on.

To see that this is so, first note the situation when the voltage on the load side of power supply 11 is relatively positive with respect to the other side of supply 11. Then device theory indicates that terminating region 15 of transistor 10, terminating region 40a of transistor 40, terminating region 28a of transistor 28, terminating region 41b of transistor 41, and terminating region 29b of transistor 29 on the relatively positive side of the channels of these transistors will all be serving as sources for these transistors.

Since gate 40c of transistor 40 and gate 29c of transistor 29 will be negative with respect to the source regions 40a and 29b of transistors 40 and 29, respectively, device theory indicates these two transistors will be switched on. The gate regions 41c and 28c of transistors 41 and 28, respectively, will be positive or approximately equal to the voltages appearing on source regions 41b and 28a of these transistors, so that device theory indicates that these transistors will be switched off. Transistor 40, in being on, will entirely shunt, or effectively short, parasitic diode 17, parasitic capacitor 20, and parasitic resistance 22 so that these will have effectively no role in circuit operation during this polarity condition of the supply 11 output voltage. Thus, a charging current will flow through load means 12, transistor 40, capacitor 27, and transistor 29 to thereby charge capacitor 27.

Also, a charging current will flow through load means 12, transistor 40, and parasitic capacitor 19 to charge parasitic capacitor 19. Again, a charging current will flow through transistor 34 and parasitic capacitance 26 to charge parasitic capacitance 26. In a similar manner, capacitances 20, 23, 24, and 25 will also be more or less charged. Were transistor 40 not present, parasitic capacitance 20 would also be charged and parasitic diode 17 forward biased.

Note that with transistors 40 and 34 both being on, gate region 14 of transistor 10 is held at the voltage appearing on both substrate connection 13 and terminating region 15 thereof. Hence, transistor 10 is indeed off.

When the polarity of supply 11 reverses so that the load side of supply 11 is negative with respect to the other side thereof, device theory indicates that terminating regions 38b, 29a, 41a, and 40b become the source regions for the associated transistors through being on the relatively positive side of the channels thereof. Since gate region 29c and gate region 40c will be positive, or approximately equal to the voltage value appearing on the source regions of these transistors, transistors 29 and 40 are switched off. However, gate region 28c and gate region 41c of transistors 28 and 41 are negative with respect to the source regions of these transistors so that these transistors are switched on.

Switching on transistor 41 rapidly discharges whatever charge has accumulated on parasitic capacitance 19 which charge otherwise would lead to a voltage thereacross. Such a voltage would add to the voltage being supplied from supply 11 to thereby increase the reverse voltage appearing across parasitic diode 17 tending to cause breakdown thereof. Furthermore, if the impedance in the charge and discharge paths for capacitances 19, 20, 23, 24, 25, and 26 are too large, the charge accumulated on these capacitors may hold gate region 14 relatively negative and tend to turn on transistor 10 despite the desire to have transistor 10 switched off in this situation. Therefore, for purposes of the circuit of FIG. 2, the discharge paths for these capacitances are assumed to be of a sufficiently low impedance to permit the discharge thereof so that transistor 10 is not switched on. Circuit means to assure this are discussed below.

Thus, in this half cycle in which the output voltage on the load means 12 side of supply 11 is relatively negative, a charging current is provided through transistor 41, capacitance 27, transistor 28, and load means 12 to thereby again charge capacitance 27 with the same polarity to which it was charged in the previous half cycle. Further, a charging current will flow through transistor 41, load means 12, and parasitic capacitance 20 to charge capacitance 20, and another charging current will flow through transistor 34 and capacitance 25 to charge capacitance 25. Parasitic capacitances 19, 23, 24 and 26 are not charged because of transistors 34 and 41 being on.

With transistor 34 being on and transistor 41 being switched on, gate region 14 remains at the voltage appearing on both substrate 13 and terminating region 16. This again assumes that there was sufficiently rapid charging and discharging of parasitic capacitances 19, 20, 23, 24, 25, and 26. Therefore, transistor 10 continues to be switched off.

Consider now switching transistor 10 on by virtue of having the output of logic gate 39 in the high state, i.e., the voltage at the output of logic gate 39 being approximately that appearing on the positive side of capacitance 27. As the sources of transistors 34 and 38 are also at this voltage, the gates of these transistors are approximately at the voltage value of the corresponding sources thereof so that both of these transistors are switched off.

However, with transistor 38 off the gate of transistor 35 will be approximately at the voltage appearing on the negative side of capacitance 27 by virtue of resistance 37. Thus, the gate of transistor 35 is at a voltage relatively negative to that appearing on the source region of transistor 35 resulting in transistor 35 being switched on. Transistor 35 being on effectively shorts gate region 14 of transistor 10 to the negative side of capacitance 27 to thereby provide a voltage on gate region 14 of transistor 10 which is negative with respect to that appearing on substrate 13 of transistor 10. This results in transistor 10 being switched on as can be understood from the following.

First taking the load 12 side of supply 11 to be positive with respect to the other side thereof, transistors 40 and 29 are again on while transistors 28 and 41 are again off. With transistor 40 on, terminating region 15 is effectively shorted to substrate region 13 of transistor 10. Thus, with transistor 35 on, gate region 14 of transistor 10 is placed negative with respect to terminating region 15 by the amount of voltage occurring on capacitance 27. This leads to transistor 10 indeed being switched on.

With transistor 10 switched on, little current will flow through transistor 29 even though it is switched on and there will be little charging of capacitance 27. On the other hand, there will not be any tendency for capacitance 27 to discharge because of reverse biased parasitic diode 17 and 18, though there may be some discharging leakage current through parasitic resistances 21 and 22 and control switching circuitry 33. Also, there will be no charging of parasitic capacitances 19 and 20 by supply 11 because terminating regions 15 and 16 will be very close to being at the same voltage. On the other hand, capacitances 23, 24, 25, and 26, will all be charged in such a manner as to tend to keep transistor 10 in the on condition which could delay turning off transistor 10, by changing the output state of logic gate 39 at some later time, unless again the associated discharge paths for these capacitances are of sufficiently low impedance.

When the polarity of the output voltage from supply 11 reverses so that the load side of supply 11 is relatively negative, transistors 28 and 41 will be on as they were in this power supply condition when FET 10 was switched off, and again transistors 29 and 40 will be switched off. With transistor 41 switched on, terminating region 16 will be at the same voltage value as substrate connection 13 of transistor 10. Again, this means that with transistor 35 on, the gate region 14 of transistor 10 will be at a negative voltage with respect to terminating region 16 which is equal to the voltage appearing on capacitance 27. Thus, transistor 10 again is switched on.

As before for transistor 29, with transistor 10 switched on, little current will flow in transistor 28 even though it is also switched on and so little charging will occur of capacitance 27. Again, there will be some discharging of capacitance 27 despite parasitic diode 17 and 18 being reversed biased, this once more being through parasitic resistances 21 and 22 and control switching circuitry 33.

As a result, the situation is such that there will not be any means for charging capacitance 27 to a voltage substantially in excess of the threshold voltage of transistor 10 during times when transistor 10 is switched on. As indicated in the above-referenced Hendrickson application entitled "Alternating Polarity Power Supply Control Apparatus", the result is that capacitance 27 will only be charged when it has lost a sufficient voltage thereacross to have transistor 10 turn off sufficiently to raise the voltage dropped thereacross enough to cause a recharging capacitance of 27. This partial on condition of transistor 10 may well become the steady state condition for the circuit of FIG. 2 (although it is possible FET 10 will turn off altogether for a half cycle) leading to less than maximum current flowing in the circuit branch comprising supply 11, load 12, and transistor 10, and causing a considerably larger power dissipation in transistor 10, all of which are undesirable.

There are at least two possible methods for avoiding this result, one of which has been previously described in the above-referenced Hendrickson application just mentioned in the preceding paragraph. That method resorts to use of load means 32 rather than the use of load means 12 in the circuit of FIG. 2 (or load means 30 in place of load means 31 by symmetry).

In that situation, the voltage drop across the load means 32 assures that there will be recharging of capacitance 27 at least one-half cycle during every cycle of supply 11. However, the disadvantage in the load 32 (30) use situation occurs because of the difficulty having transistor 28 (29) provided in a common substrate of a monolithic integrated circuit along with transistors 10, 29(28), 40, 41, 34, 35, and 38. That is, transistor 28(29), or an actual diode if used rather than a transistor, must be provided so its substrate is isolated from the substrates of the other circuit components, i.e., from the substrate of the monolithic integrated circuit chip in which the other components are all formed if an integrated circuit version of the FIG. 2 circuit is to be used.

The other method available permits using load means 12 as described above in the operation description, as opposed to the preceding method which requires use of load means 32 (or load means 31 instead of load means 30 by symmetry) so that transistor 28(29) can be integrated along with the other circuit components. This method is implemented by use of the circuit components shown at the input of logic gate 39. The other input to logic gate 39 is, remember, the input for a control signal, a switch or otherwise to provide for external control of the circuit of FIG. 2.

The circuit component shown connected to the first input of logic gate 39 forms a voltage level detector circuit for sensing the voltage level between the positive and negative sides of capacitance 27. This circuit function depends on use of an operational amplifier, 43, and a voltage reference device, 45, shown as a zener diode in the circuit of FIG. 2. Operational amplifier 43 has a feedback resistance, 44, connected between its output and the positive input thereof as well as having a voltage referenced circuit connected to this same positive operational amplifier input consisting of a series combination of, first, a resistance, 46, and second, the parallel combination of resistance 47 and the voltage reference device 45. This series combination is provided across capacitance 27. The negative operational amplifier input has a voltage divider circuit connected thereto consisting of a series combination of a resistance, 48, and another resistance, 49. This latter series combination is also provided across capacitance 27. Also to be noted is that the power connections for operational amplifier 43 and logic gate 39, although are not shown, are connected in such a way that power to these circuit components is also supplied from across capacitance 27.

Voltage reference 45 and resistors 46 and 47 place the positive operational amplifier input at a more or less fixed voltage below the voltage value on the positive side of capacitance 27 as long as the voltage across capacitance 27 exceeds the voltage reference value of voltage reference 45. The voltage divider circuit formed by resistors 48 and 49 sense the voltage across capacitance 27, and when the portion provided across resistance 49 is less than the voltage reference value of reference 45, the output of operational amplifier 43 is driven close to the value on the negative side of capacitance 27. When the voltage across resistance 49 is greater than this voltage reference value, the output of operational amplifier 43 is switched to approximately the voltage value appearing on the positive side of capacitance 27.

The switching of operational amplifier 43 will be quite rapid with voltage changes on resistor 49 which go above or below the voltage reference value of voltage reference 45. This is because of the positive feedback due to resistor 44 around operational amplifier 43 and the high gain thereof. Resistor 44 also provides hysteresis in the switching characteristic to reduce output oscillation.

Thus, insuffient voltage across capacitance 27 will be reflected in the voltage on resistance 49 being less than the voltage reference value of voltage reference 45 with the result that the output voltage of operational amplifier 43 will be approximately equal to the voltage value on the minus side of capacitance 27. Logic gate 39, being an AND logic gate, will then also have its output close to the voltage value appearing on the negative side of capacitance 27, thereby switching transistors 34 and 38 on while transistor 35 will be switched off. As indicated earlier, this will result in transistor 10 being switched off for some point in a half cycle of the output voltage of supply 11 thereby permiting capacitance 27 to be recharged by supply 11.

If this recharging of capacitance 27 takes place, a voltage value thereacross will be reached which the voltage value on resistance 49 will exceed the voltage reference value of voltage reference 45 thereby switching operational amplifier 43. Thus, FET 10 will again turn on if the signal on the input of logic gate 39 used for controlling the circuit of FIG. 2 still so commands. Hence, FET 10 will always be either switched fully on or switched fully off as commanded during operation of the circuit of FIG. 2.

The situation may well arise where an assumption made and discussed in the operation of the circuit of FIG. 2 does not hold. That is, the charging and discharging of parasitic capacitances 19, 20, 23, 24, 25, and 26 may not be accomplished fast enough with respect to each of the successive time durations in which the opposite polarity alternately occurs in the output voltage provided by alternating polarity power supply 11. In these circumstances, further circuit improvements will be desired to obviate the detrimental effects on circuit operation which these undischarged capacitances would otherwise cause.

Figure 3:
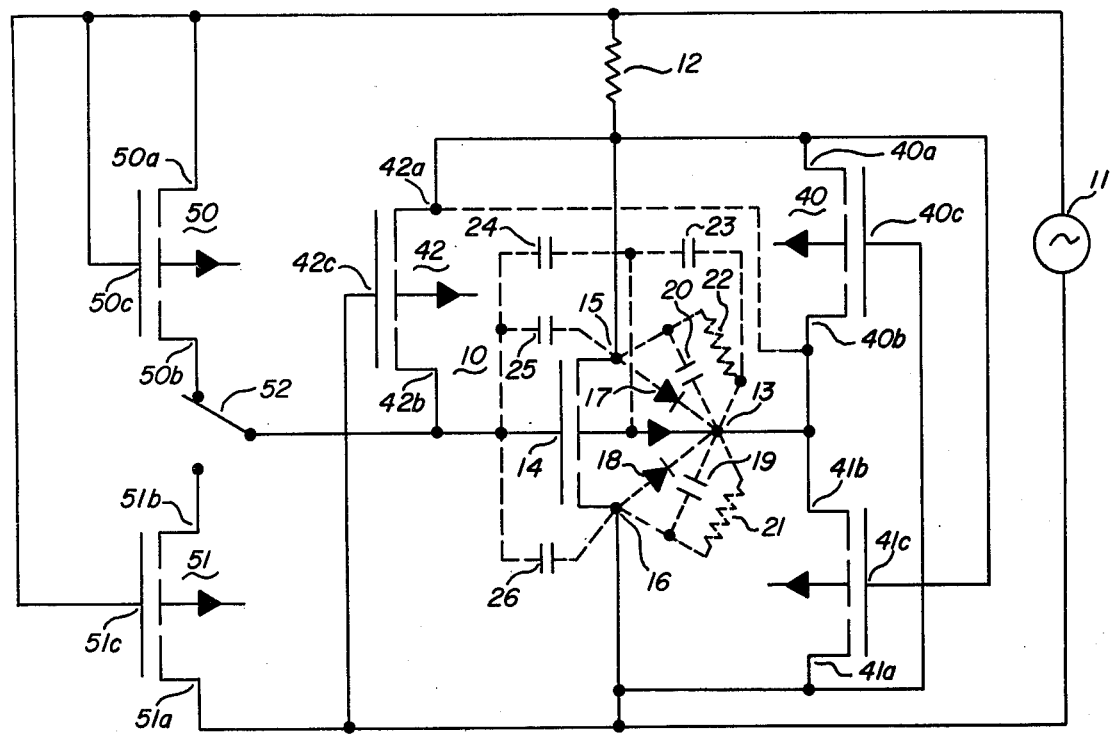
FIG. 3 shows a second embodiment of the circuit of the invention.

FIG. 3 shows a basic circuit for operating a field-effect transistor typically of the type used as transistor 10 in the circuit of FIG. 2, i.e., of the type described in the above-referenced patent applications by Hendrickson and Hendrickson et al., entitled "Semiconductor Apparatus". This circuit has omitted from it the feature of providing constant polarity power for operating any control circuits to be used in the control of the field-effect transistor 10. Again, field-effect transistor 10 is shown with all the effective parasitic circuit components associated therewith as were shown in the circuits of FIGS. 1 and 2. The components in the FIG. 3 circuit corresponding to components in the FIG. 2 circuit have retained the same designations in FIG. 3 as they had in FIG. 2.

The primary addition in the circuit of FIG. 3 is the addition of a further bypass transistor, 42, between the terminating region 15 of transistor 10 and gate region 14 thereof. That is, the terminating region, 42a, of transistor 42 is connected commonly with terminating region 15 of transistor 10. The other terminating region, 42b, of transistor 42 is connected in common with gate region 14 of transistor 10. Finally, the gate region, 42c, of transistor 42 is connected to supply 11, or equivalently, to terminating region 16 of transistor 10.

A switch means, 52, and a pair of transistors, 50 and 51, have been added to the basic portion of the circuit of FIG. 3 to control the switching on and off of transistor 10. Switch means 52, shown as a mechanical switch but which could be an electronic switch, is a single pole, double throw switch for switching between a terminating region, 50b, of transistor 50 and a terminating region, 51b, of transistor 51. The gate regions, 50c and 51c of transistor 50 and 51, respectively, are both connected to power supply 11 and load means 12 as is the remaining terminating region, 50a, of transistor 50. The remaining terminating region, 51a, of transistor 51 is connected to supply 11.

Again, transistors 40, 41, 42, 50 and 51 are all signal control transistors and generally not capable of managing very substantial power transfers in power circuits. Transistor 10 continues, as it has in the earlier circuits of FIGS. 1 and 2, as the primary power transfer control component for controlling the power transfers from alternating polarity voltage power supply 11 to load means 12. All of the transistors shown in FIG. 3 are again enhancement mode, p-channel, MOSFETS although they need not necessarily be. A depletion mode transistor being used for transistor 10 will be described below.

In operation, consider first the situation of transistor 10 switched to the off state by having switch means 52 connected to terminating region 51b of transistor 51. If the load side of supply 11 is taken as being relatively negative with respect to the other side thereof, device theory indicates that terminating regions 16 of transistor 10, terminating region 51a of transistor 51, terminating region 41a of transistor 41, and terminating region 40b of transistor 40 on the relatively positive side of the channel of these transistors, will be serving as sources thereof. Gate region 51c will be connected to the most negative voltage in the circuit and therefore transistor 51 will be switched on thereby effectively shorting gate region 14 of transistor 10 to terminatin region 16 thereof which, shorting gate to source of transistor 10, switches transistor 10 off.

Also, gate region 41c of transistor 41 is connected to load 12, a point where the voltage is more negative than is the connection point of terminating region 41a to the most positive voltage in the circuit. Terminating region 41a is serving as the source for transistor 41 and device theory therefore indicates that transistor 41 will be switched on. Transistor 40, on the other hand, will be switched off because gate region 40c thereof is connected to the most positive voltage in the circuit of FIG. 3. Finally, transistor 42 will be off because transistor 51, in being switched on, effectively shorts gate region 42c of transistor 42 to terminating region 42b thereof serving as the source. Of course, transistor 50 is out of the circuit entirely.

With transistor 41 being on and transistors 10, 40 and 42 being off, charging currents will flow to charge parasitic capacitances 20 and 25. Parasitic capacitance 20 will charge through both transistor 41 and capacitance 19, in parallel, and through load means 12 while parasitic capacitance 25 will charge through both transistor 51 and capacitance 26 in parallel, and through load means 12. Of course, capacitance 20 would charge through parasitic diode 18 even if transistor 41 were eliminated from the circuit. Parasitic capacitances 19, 23, 24 and 26 will not charge because of the on condition of transistors 51 and 41.

For at least some kinds of waveforms in the output voltage of supply 11 and some frequency of polarity alternation in this output voltage, charge will remain on capacitances 20 and 25 at the time that supply 11 reverses polarity so that the load side of supply 11 becomes relatively positive to the other side thereof. Thus, the description of the behavior of the circuit when the load means side of supply 11 becomes positive requires accounting for the stored charge on capacitances 20 and 25.

As the side of supply 11 connected to load means 12 swings positive relative to the other side of supply 11, terminating region 42a of transistor 42 and terminating region 40a of transistor 40 begin to serve as sources for these transistors. Since the gates of each of these transistors will be connected to the most negative voltage in the circuit, device theory indicates that transistors 40 and 42 will be switched on. Also, terminating region 51b of transistor 51 will be connected to a positive voltage in the circuit of FIG. 3 through on transistor 42 while gate region 51c of transistor 51 will also be connected to a positive voltage thereby rendering transistor 51 off.

Terminating region 15 of transistor 10 will serve as a source for that transistor, in being relatively positive with respect to terminating region 16, and so transistor 42 effectively shorts gate region 14 of transistor 10 to terminating region 15 to thereby keep transistor 10 off. However, this is not immediate as parasitic capacitance 25 must be discharged. So for a short time, the voltage across parasitic capacitance 25 is added to the voltage provided by supply 11 between gate region 14 and terminating region 16 of transistor 10.

Similarly, the voltage developed across capacitance 20 is added to the voltage provided by supply 11 reverse biasing parasitic diode 18 until parasitic capacitance 20 is discharged. The discharge of parasitic capacitance 20 is accomplished by both transistor 40 switching on and by transistor 41 which is held on after the polarity reversal by the voltage across parasitic capacitance 20 until that capacitance has discharged sufficiently.

Hence, the breakdown characteristics of transistor 10 between its gate region and its terminating region, and between its substrate and its terminating regions, need be only a little more than the peak voltage provided by supply 11 for many waveforms in the output voltage of supply 11 because of the discharging action of transistors 40, 41 and 42. However, higher breakdown voltages would be required of transistor 10 for supply 11 output voltage waveforms having characteristic rise times therein which are relatively short compared to the discharge times achieved by use of transistors 40, 41 and 42.

Further, no charging of parasitic capacitances 23 and 24 occurs which would tend to switch on transistor 10 as the polarity of the voltage provided by supply 11 changes despite the intention of having transistor 10 switched off. The charge stored on capacitances 20 and 25 are prevented from having this same effect by being discharged. Finally, effective pnp bipolar transistor action between terminating regions 15 and 16 of transistor 10 is prevented by transistors 40 and 41 carrying current that would otherwise flow through parasitic diodes 17 and 18.

Of course, in this second and succeeding supply 11 polarity condition in which the load side thereof is positive, parasitic capacitance 19 will charge via switched on transistor 40, and parasitic capacitance 26 will charge via switched on transistor 42. This charging occurs in the same manner in which parasitic capacitances 20 and 25, respectively, were charged by transistors 41 and 51 during the previous polarity condition when the load side of supply 11 was negative rather than positive. Thus, after the next polarity reversal when the supply 11 polarity reverts to the first polarity condition, similar discharging of capacitances 19 and 26 will occur as has been described for capacitances 20 and 25.

Consider now having switch means 52 connect terminating region 50b of transistor 50 to gate region 14 of transistor 10 during this same polarity condition in the output voltage provided by supply 11, i.e., when load means side of supply 11 is positive. In this situation, terminating region 50a of transistor 50, in being positive with respect to terminating region 50b thereof, serves as the source. Since gate region 50c thereof is directly connected to terminating region 50a, device theory indicates that transistor 50 is switched off.

Hence, having switch means 52 connect transistor 50 into the circuit during this polarity condition has no effect on the operation of the circuit of FIG. 3 because gate region 14 of transistor 10 is not subjected to any difference in having switch means 52 connected to off transistor 51 as opposed to having switch means 52 connected to off transistor 50. Therefore, field-effect transistor 10 cannot be switched on when the output voltage of supply 11 on the load side of supply 11 is relatively positive—at least where there has not been any charging of parasitic capacitances 23 and 24 permitted in the previous polarity condition of supply 11 in which the load side of supply 11 is relatively negative.

Now consider the situation when switch means 52 connects terminating region 50b of transistor 50 to gate region 14 of transistor 10 at a time when the output voltage of supply 11 on the load side thereof is negative relative to the other side thereof. Then, terminating region 50b of transistor 50 will be serving as the source thereof in being positive relative to terminating region 50a. Device theory indicates that transistor 50 will be switched on since gate 50c thereof is connected to the negative side of supply 11. On the other hand, terminating region 42b of transistor 42 also serves as the source for that transistor, but gate region 42c is connected to the positive side of source 11 and so transistor 42 is switched off.

As a result, gate region 14 of transistor 10 is effectively shorted to the negative side of supply 11 by transistor 50. Terminating region 16 of transistor 10 is connected to the positive side of supply 11 and so acts as a source of transistor 10. Device theory indicates that transistor 10 will then be switched on. With transistor 10 switched on sufficiently so that only a very low voltage is dropped between terminating regions 15 and 16, the operation of transistors 40 and 41 is of relatively little significance since they are effectively shorted out by transistor 10. On the other hand, in applications where there is a substantial voltage developed between terminating regions 15 and 16 despite transistor 10 being switched on, transistors 40 and 41 will still serve to discharge parasitic capacitances 19 and 20 to thereby continue proper circuit operation. Of course, when transistor 10 is on, power is transferred from supply 11 to load means 12.

Of particular importance for the subsequent polarity condition of the output voltage of supply 11 in which the polarity of supply 11 is reversed, the foregoing switching on of transistor 10 leads to parasitic capacitance 24 being charged through transistor 50. Capacitance 24 is charged with a polarity which will tend to maintain transistor 10 switched on, i.e., the gate side of capacitance 24 will be negative. When the polarity of supply 11 does subsequently change so that the load means 12 side thereof is relatively positive, transistor 42 will be unable to switch from being off to being on. This follows because terminating region 42a of transistor 42 is effectively shorted to the negative side of supply 11 by transistor 10 remaining switched on while terminating region 42b is held even more negative by the accumulated charge on parasitic capacitor 24. Thus, terminating region 42a in being relatively positive serves as the source of transistor 42. Since gate region 42c of transistor 42 is connected to what is now the negative side of supply 11, device theory indicates that transistor 42 will be switched off because terminating region 42a, serving as the source, is effectively shorted to gate region 42c through transistor 10 being on.

Further, capacitances 24, 25 and 26 also hold gate region 14 negative with respect to substrate connection 13, and to terminating region 15 serving as the source thereby maintaining transistor 10 on as transistor 50 has switched off with the polarity change in the output voltage of supply 11. Transistor 50 is off because both gate region 50c and terminating region 50a, now serving as the source, since the load side of supply 11 is positive, are connected to one another.

Hence, there is no discharge path for parasitic capacitance 24 beyond high impedance leakage paths. So, for sufficiently rapid polarity alternations of supply 11, there will be sufficient charge in parasitic capacitances 24, 25 and 26 to maintain transistor 10 in an on condition until the polarity of supply 11 reverses so that the load side thereof again becomes relatively negative. When this occurs and switch means 52 remains connected to the terminating region 50b of transistor 50, parasitic capacitances 24, 25 and 26 will recharge to whatever extent is required to cover discharge losses occurring during the previous polarity condition, such as due to leakage paths, when the output voltage of supply 11 on the load means side thereof was positive.

Note that transistor 10, once on, cannot be switched off during times when the load side of supply 11 is positive by changing switch means 52 to eliminate transistor 50 and place transistor 51 back in the circuit. This is because such a change still does not provide a discharge for capacitances 24, 25 and 26 since transistor 51 will be off.

As is evident, the time duration required to discharge parasitic capacitances 24, 25 and 26 via leakage paths to a point sufficient to cause transistor 10 to turn off is the only significant factor limiting how long the on state of this transistor can be maintained when there is a positive voltage on the load side of supply 11. For ordinary device structures this duraction will typically be hours. External capacitance could be added to increase this time duration as could other kinds of energy storage means. There is not time limit to keeping transistor 10 on in the opposite output voltage polarity condition nor is there any time limit in the off state.

The substrates for all of the transistors shown in FIG. 3 can be connected in common without altering the operation of the FIG. 3 circuit. As a result, the field-effect transistors 10, 40, 41, 42, 50 and 51 can all be provided in a monolithic integrated circuit chip on a common substrate. Further, although terminating region 42a of transistor 42 is shown connected to both terminating region 15 of transistor 10 and load means 12, terminating region 42a could alternatively be connected to substrate connection 13 of transistor 10. This latter connection is shown by a dashed line in FIG. 3. Such a termination would not alter the operational result of the circuit of FIG. 3.

Note that field-effect transistor types could be mixed in a circuit of the FIG. 3 type with the primary power transistor control field-effect transistor, transistor 10, being either an n-channel or a p-channel FET and one or more of the other bypass or control field-effect transistors being of the opposite kind. For instance, the connection points of terminating region 42a and gate region 42c of transistor 42 in FIG. 3 could be interchanged with transistor 42 being an n-channel field-effect transistor rather than the p-channel transistor shown. Similar kinds of changes could be made for some of the other transistors shown in FIG. 3 with some additional circuit components required for best operation in at least some instances.

Figure 4:
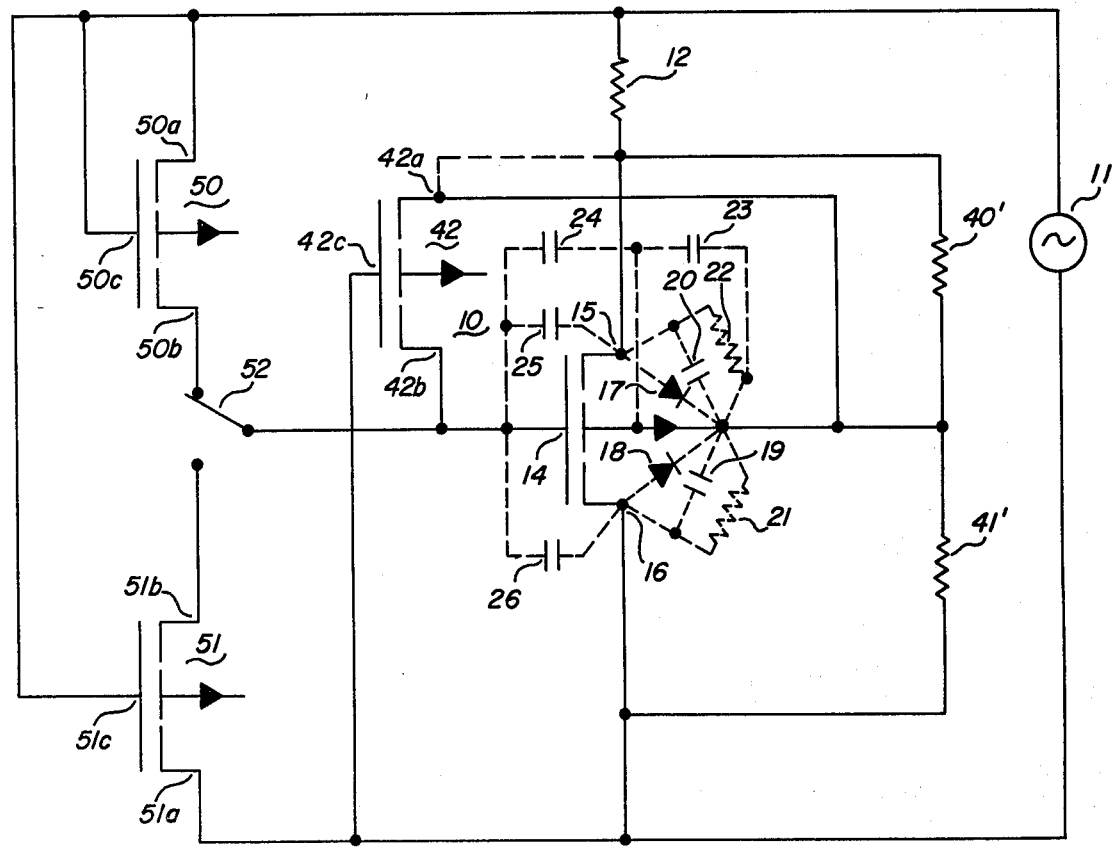
FIG. 4 shows a third embodiment of the circuit of the invention.

The dashed line alternative connection for transistor 42 in FIG. 3 is shown as the primary connection for transistor 42 in FIG. 4. There, terminating region 42a of transistor 42 is shown connected to substrate connection 13 of transistor 10. Circuit components in the circuit of FIG. 4 which correspond to components in the circuit of FIG. 3 retain the same designations in FIG. 4 as they had in FIG. 3.

Further change over the FIG. 3 circuit is seen in the circuit of FIG. 4 in that this latter figure shows that other kinds of circuit components can be used as bypass means rather than just field-effect transistors. Transistors 40 and 41 of the circuit of FIG. 3 have been replaced in FIG. 4 by resistances, 40' and 41', respectively, although other kinds of circuit components capable of providing the bypass or shunting function could be used though perhaps some additional circuit components might be needed also. Resistors 40' and 41' can provide some of the same functions in the circuit of FIG. 4 as did transistors 40 and 41 in the circuit of FIG. 3 in that they also provide a discharge path for parasitic capacitances 19 and 20. To accomplish this, resistances 40' and 41' must be substantially less in resistance value than parasitic resistances 21 and 22. On the other hand, resistances 40' and 41' must be considerably larger in value than the impedance of load means 12 if transistor 10 is to retain full control over power transfer from supply 11 to load means 12. Otherwise substantial power dissipation will occur continually in load means 12, and substantial power will also be dissipated in resistances 40' and 41' when transistor 10 is off. A typical value of resistance for resistances 40' and 41' is 10 to 100 times the impedance value of load means 12.

However, resistances 40' and 41' cannot provide nearly as good a shunt function across the junctions of parasitic diodes 17 and 18 as do transistors 40 and 41 in the circuit of FIG. 3 because each of these transistors can be switched on sufficiently to have a very low impedance between its terminating regions, lower than is possible to be used for resistors 40' and 41'. Yet the off condition impedance values of transistors 40 and 41 will be much higher than the resistance values of resistances 40' and 41'. Thus, the supply 11 output voltage polarity alternation frequency capability of the circuit of FIG. 4 may well be considerably less when using some kinds of transistor structures for transistor 10 than would be the capability of the circuit of FIG. 3 for the same transistor structures. This is because the polarity alternation frequency may have to be kept smaller to prevent any parasitic pnp transistor action between the terminating regions 15 and 16 of transistor 10.

A further possibility would be to have resistances 40' and 41' of FIG. 4 provided in the circuit of FIG. 3 connected to the same points there to which they are connected in FIG. 4. This, for instance, would provide shunting of transistor 10 when the voltage of supply 11 is in the range of the threshold voltages of transistors 40 and 41 when neither of these transistors may be switched on.

Figure 5:
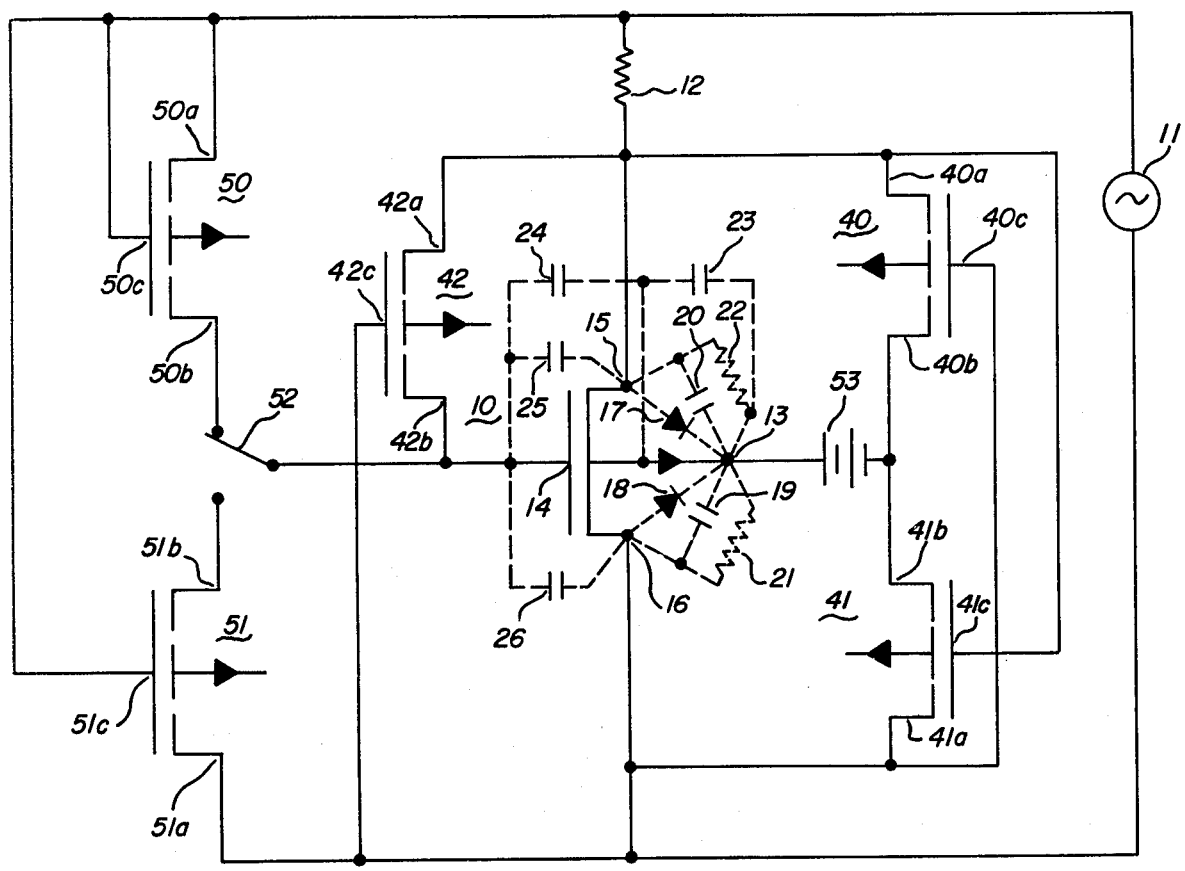
FIG. 5 shows a fourth embodiment of the circuit of the invention.

FIG. 5 shows the circuit of FIG. 3 where a depletion mode, p-channel, metal-oxide-semiconductor field-effect transistor, 10', has been substituted for the enhancement mode, p-channel field-effect transistor 10 as shown in FIG. 3. Though a depletion mode, metal-oxide-semiconductor field-effect depletion mode transistor is shown in FIG. 5, other types of depletion mode transistors could also be used therein such as junction field-effect transistors (JFETS) or metal-semiconductor field-effect transistors (MESFETS). The addition of an energy storage means, 53, shown in FIG. 5 as a battery provides the voltage potential used to bias off the depletion mode transistor 10' so that the circuit will then operate in approximately the manner described for the circuit of FIG. 3.

All of the circuits shown in FIGS. 3, 4, and 5 can also be implemented using n-channel field-effect transistor devices such as enhancement mode, n-channel MOSFETS. The operation of the circuits will be unchanged except that voltage polarities and current directions will be reversed.

Figure 6:
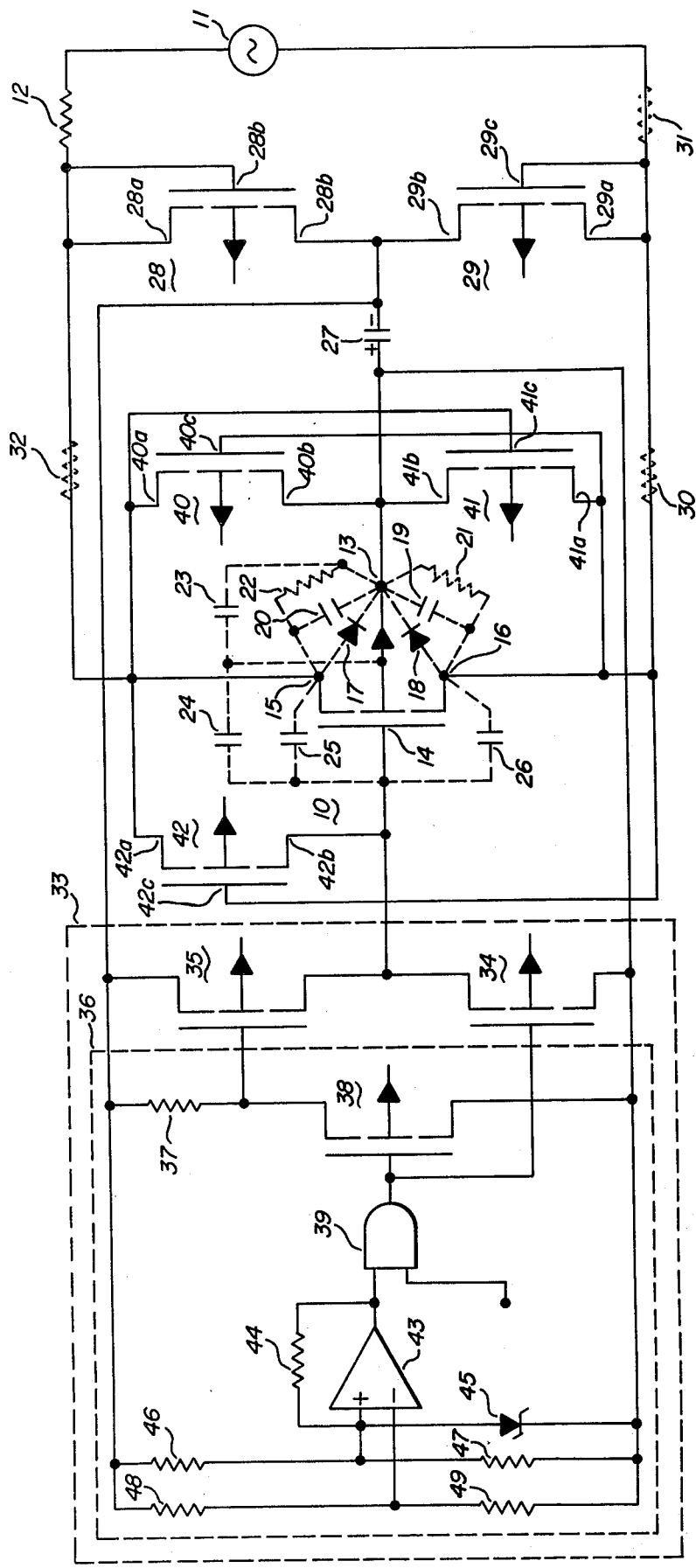
FIG. 6 shows a fifth embodiment of the circuit of the invention.

FIG. 6 shows how the basic clamping circuit described in FIG. 3 can be fully implemented in the circuit of FIG. 2. In the circuit of FIG. 2, only bypass transistors 40 and 41 were shown and described (and which in the alternative, could be replaced by the resistances 40' and 41' of FIG. 4 within the same effects given in the description for that figure). In FIG. 6, bypass transistor 42, first introduced in the circuit of FIG. 3, has been added and operates approximately as described for the circuit of FIG. 3. The other differences occur in the alternative switch control circuitry used, involving switch means 52 and transistors 50 and 51 in FIG. 3 and involving transistors 34, 35 and 38, resistor 37 and logic gate 39 in FIG. 6. The active switching of gate region 14 of transistor 10 to either the transistor 10 substrate or to the negative voltage on capacitance 27 provided by transistors 34 and 35 eliminates the need to depend on charging gate capacitance to keep transistor 10 on when the load side of supply 11 is positive. This active switching also would eliminate the function of transistor 42 if the voltage across capacitance 27 were always sufficient to operate the switch control circuitry containing transistors 34 and 35. However, at circuit operating start-up and at times when the voltage on capacitance 27 drops low enough to require recharge of capacitance 27, transistor 42 ensures that transistor 10 is off so capacitance 27 can be charged quickly and fully. Thus, FIG. 6 shows providing bypass transistors 40, 41, 42, and 34, the latter also part of the switch control circuitry, between each of the terminal regions provided in transistor 10 to thereby provide, along with transistors 34 and 35, continual active control with respect to all of the parasitic circuit devices associated with transistor 10. All of these transistors can be provided in a monolithic integrated circuit chip along with the other control circuit components shown in FIG. 6. Earlier comments on also integrating transistors 28 and 29 again apply.

Of course, the transistors shown in FIG. 6 could be enhancement mode, n-channel, MOSFETS rather than the enhancement mode, p-channel, MOSFETS shown in FIG. 6. Again, voltage polarities and current directions will be reversed in the operation of an n-channel device circuit from what they are in the p-channel device circuit shown in FIG. 6.

Figure 7:
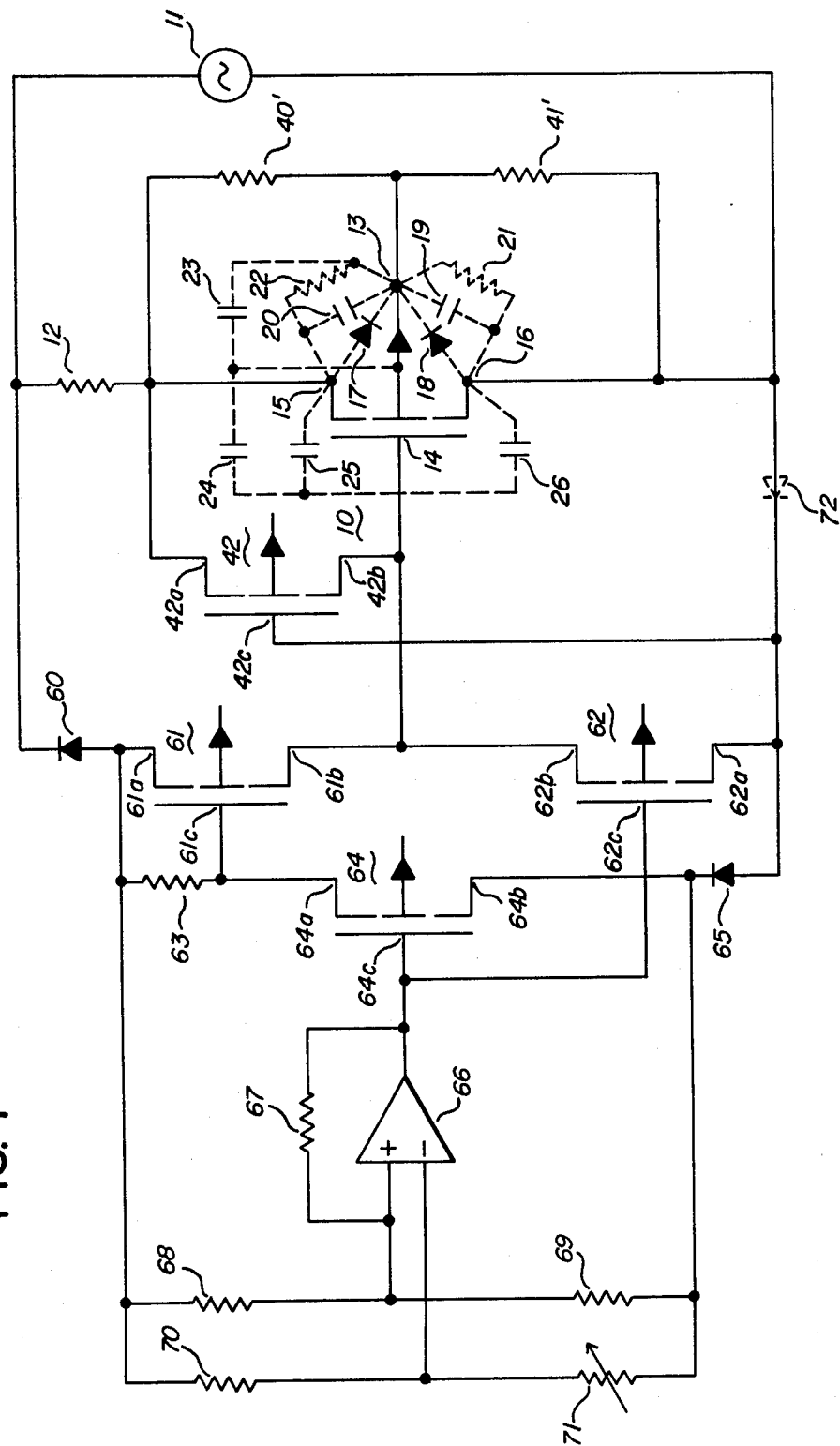
FIG. 7 shows a sixth embodiment of the circuit of the invention.

FIG. 7 shows using the basic circuit of FIG. 4 employing both bypass transistor 42 and bypass resistances 40' and 41' of FIG. 4. The circuit of FIG. 7 is also capable of providing constant polarity power for the control circuit used there, as do the circuits of FIGS. 2 and 6, but without use of an energy storage means for this purpose. The circuit of FIG. 7 operates quite similarly to the basic circuits shown in FIGS. 3 and 4 insofar as transistor 10 and the immediate bypass devices shown therewith are concerned, these being controlled in turn by the constant polarity power supply circuit arrangement in the remainder of FIG. 7.

However, in connection with describing the operation of the constant polarity power supply portion of the circuit of FIG. 7, the operation of transistor 10 and bypass transistor 42 will also be described.

The circuit portion operated by constant polarity power is provided single polarity voltage by virtue, first, of a diode, 60, having its cathode connected to supply 11. A pair of transistors in series combination, 61 and 62, are connected from the anode of diode 60 at a terminating region 61a, of transistor 61, on one side of the combination, to the connection on supply 11 not connected to diode 60 at another terminating region, 62a, of transistor 62 on the other side of the combination. Terminating regions 61b and 62b of these transistors are connected to one another and to gate region 14 of transistor 10.

Another series combination, connected between the same points, comprises a resistance, 63, a transistor, 64, and a second diode, 65, this latter diode also contributing to providing constant polarity power. Resistance 63 is connected at one end thereof to the anode of diode 60, and at the other end to both a terminating region, 64a, of transistor 64, and to a gate region, 61c, of transistor 61. connected to the cathode of diode 65 with the anode of diode 65 connected to supply 11. An operational amplifier, 66, is connected to a gate region, 64c, of transistor 64 and another gate region, 62c of transistor 62. Operational amplifier 66 has a sensor bridge connected across its positive and negative input terminals and a positive feedback resistance, 67, connected between its positive input terminal and its output. The impedances in the sensor bridge which controls operational amplifier 66 are shown as resistances, though they need not be, and are designated 68, 69, 70 and 71. Resistance 71 is shown as a variable resistance corresponding to a sensor but could also be represented by a current source or a voltage source.

First, assume that conditions in the bridge are such that operational amplifier 66 has an output voltage value close to the relatively negative voltage occurring at the anode of diode 60 when the load means side of supply 11 is relatively negative with respect to the other side thereof. Terminating regions 61b of transistor 61, 62a of transistor 62, and 64b of transistor 64 will be serving as sources of these transistors in being on the relatively positive side of the channels thereof. Since the output voltage on operational amplifier 66 is negative, transistors 62 and 64 will be switched on while transistor 61 will be switched off.

Transistor 42 will also be switched off as transistor 62 will effectively short terminating region 42b of transistor 42 and gate region 14 of transistor 10 to the presently positive side of supply 11 and to terminating region 16 of transistor 10. This region 42b of transistor 42 is serving as the source thereof in being on the positive side of the channel of that transistor and this source, in being effectively shorted to gate region 42c, renders transistor 42 off. This assumes that parasitic capacitances 24 and 26 are previously discharged. Similarly, terminating region 16 serves as the source of transistor 10 and it is also effectively shorted to gate region 14 by transistor 62 so that transistor 10 is also switched off.

As the polarity of the output voltage provided by supply 11 reverses so that the load side of supply 11 becomes relatively positive, power is removed from the circuitry connected to the anode of diode 60 insofar as being supplied directly by supply 11 because diodes 60 and 65 become reverse biased. However, with no significant charge having accumulated on parasitic capacitance 24 during this previous polarity condition—because transistor 62 was on—transistor 42, in face of the polarity reversal of supply 11, now switches on which effectively shorts gate region 14 to terminating region 15 of transistor 10. Since terminating region 15 becomes relatively positive with respect to terminating region 16 upon the polarity reversal of supply 11, terminating region 15 is serving as the source of transistor 10. The shorting of gate region 14 thereto leads to transistor 10 being switched off and parasitic capacitance 24 again will not charge to any significant voltage.

Also in this situation, diode 65 prevents transistor 62 from switching on thereby causing gate region 14 of transistor 10 to be effectively shorted to the negative side of supply 11 leading to switching on transistor 10. If diode 65 were eliminated by shorting therearound, gate region 62c of transistor 62 might be forced negative with respect to terminating region 62b serving as a source by current leakage paths across or around gate region 64c of transistor 64. Diode 65 prevents any such leakage currents. Further, another kind of input control circuit operating transistor 64, or even the circuit within operational amplifier 66, may provide an impedance between gate region 64c of transistor 64 and what is now the cathode of diode 65. Any eliminating then of diode 65 by a short would certainly lead to switching on transistor 10.

In the contrary input control command situation, when the output voltage of operational amplifier 66 is near the voltage provided by supply 11 on the side thereof opposite that to which load means 12 is connected, with the load side of supply 11 being relatively negative, transistors 62 and 64 will be switched off. This is because the gates thereof are held at voltages near the voltages occurring on terminating regions 64b of transistor 64 and 62a of transistor 62 which, in being on the positive sides of the channels of these transistors, are serving as the sources thereof.

However, gate 61c of transistor 61 will be at the voltage appearing on the anode of diode 60 via resistor 63. This voltage, because the cathode of diode 60 is connected to the negative side of supply 11, will be relatively negative to that appearing on terminating region 61b which therefore serves as the source of transistor 61. As a result, gate 61c is negative with respect to the source of transistor 61, and transistor 61 will be switched on.

Switching on transistor 61 effectively shorts gate region 14 of transistor 10 to the anode of diode 60 which is just a diode voltage drop above the negative voltage value occurring on the load side of supply 11. In view of terminating region 16 of transistor 10 being connected to the positive side of supply 11, transistor 10 is switched on and parasitic capacitance 24 is charged sufficiently to have the voltage thereacross exceed threshold voltage of transistor 10. Gate region 42c of transistor 42 is connected to the positive side of supply 11 and is therefore off since this gate is at the most positive voltage in the circuit. Transistor 10, in switching on, effectively shorts terminating region 42a thereof to this same most positive voltage point. Parasitic capacitance 23 and 24 are charged by supply 11 through parasitic diode 18, transistor 61 and diode 60.

Because of the charge stored in capacitance 24, the occurrence of the positive output voltage provided by supply 11, on the side thereof opposite the side connected to load means 12, at any time dropping below a voltage value reached there at any time earlier during the same polarity condition portion of this output voltage leads to terminating region 61b becoming negative with respect to terminating region 61a. This causes terminating region 61a of transistor 61 to become the source for transistor 61 in this circumstance and, with gate region 61c connected thereto through resistor 63, transistor 61 will switch off. However, the charge on capacitance 24 cannot dissipate, except by leakage, because transistors 42, 62 and 64 will also remain off. The voltage on the side of supply 11 not connected to load means 12 will continue to diminish until the polarity of supply 11 reverses.

When the polarity of supply 11 reverses so that the side thereof connected to load means 12 becomes relatively positive, diode 60 is reversed biased as is diode 65 which prevents power being supplied from supply 11 to transistors 61, 62 and 64 as well as the sensing circuit associated with operational amplifier 66. With transistors 61, 62 and 63 no longer being provided power directly by supply 11, they will no longer play a significant role in the operation of the circuit in this polarity portion of the output voltage of supply 11. Therefore, transistor 10 will be controlled only by the charge stored on parasitic capacitance 24 which is of such polarity as to keep transistor 10 switched on.

With transistor 10 switched on, terminating region 42a of transistor 42 is effectively shorted to the negative side of supply 11, a point to which gate region 42c thereof is already connected. The charge on parasitic capacitance 24 keeps terminating region 42b of transistor 42 negative with respect to gate region 42c and terminating region 42a of transistor 42, and so transistor 42 is off. Thus, placing the output voltage of operational amplifier 66 near voltage values appearing on the side of supply 11 not connected to load means 12—when this supply side is relatively negative—leads thereafter to transistor 10 being switched on for either polarity appearing subsequently on this side of supply 11.

Again, as in FIG. 3, transistor 10 in the circuit of FIG. 7 cannot be switched on during times when the load side of supply 11 is relatively positive since there is no way in which capacitance 24 can be charged so the side thereof connected to gate region 14 is negative. Also again note that with parasitic capacitance 24 charged, transistor 10 cannot be switched off during times when the load side of supply 11 is positive because there has been no provision made for discharging capacitance 24 under these circumstances. Thus, this circuit differs from that in FIG. 6 where transistor 10 therein can be switched on and off in either polarity condition occurring in the output voltage of supply 11.

As earlier described, diode 65 is used to prevent any leakage occurring through gate region 64c of transistor 64 from switching on transistor 62 during times when the load side of supply 12 is relatively positive and transistor 10 is intended to be switched off. This function could also be accomplished by eliminating diode 65 and substituting an alternative diode, 72, shown by dashed line construction in FIG. 7. Actually, either diode 65 or diode 72 could be eliminated entirely if the on resistance of transistor 42 is sufficiently low and if there were no substantial leakage paths across or around transistors 61, 62 and 64, and if there were no substantial circuit impedances or leakage paths occurring between the output of operational amplifier 66 and terminating region 64b of transistor 64 or the side of supply 11 opposite that connected to load means 12.

Transistors 61, 62, and 64, as well as the sensing circuit associated with operational amplifier 66, are operated only when the load side of supply means 11 is relatively negative because of diode 60. This prevents transistor 10 from being switched off at those times it is intended to be on during which supply 11 also has its output voltage on the load connected side thereof positive. In the absence of diode 60 in these circumstances, transistor 61 would switch on and begin to discharge parasitic capacitance 24 leading to transistor 10 being switched off. Diode 60 may have a reverse bias voltage thereon equal to twice the peak voltage being provided by supply 11 because of stored charge in capacitance 24.

Note that use can be made of the pulsed, constant polarity voltage appearing between the cathode of diode 65 and the anode of diode 60 when the load side of supply 11 is relatively negative to provide power for other electronic circuits possibly provided in the same monolithic integrated circuit chip in which the circuit of FIG. 7 is provided. That is, transistors 10, 42, 61, 62, and 64 and resistances 40' and 41' could all be provided in the same monolithic integrated circuit chip along with diodes 60 and 65 which may be transistors connected to behave as diodes. Once again all of these transistors could be enhancement mode, n-channel, MOSFETS rather than the enhancement mode, p-channel MOSFETS shown. Additionally, the sensing circuit associated with operational amplifier 66 can also be provided in the same monolithic integrated circuit chip, although often sensor 71 would be provided as an external component with respect to the chip. Of course, the functions of the sensing circuit and the control transistors could be provided by other kinds of components such as bipolar transistors in some other circuit electrically energized by the constant polarity pulsed voltage provided in the circuit of FIG. 7.

Resistances 40' and 41' operate in just the manner described in connection with the circuit of FIG. 4 in discharging the parasitic capacitances 19 and 20 associated with transistor 10. Of course, these resistances could be replaced by the transistors 40 and 41 of FIG. 3 or by other kinds of circuit components capable of providing the bypass or shunting function.

Operational amplifier 66 is powered by the pulsed, constant polarity voltage appearing between the cathode of diode 65 and the anode of diode 60 although these power connections are not shown. In operation, resistances 68, 69, 70 and 71 form a bridge circuit in which the sensor acts to force the output voltage of operational amplifier 66 to its positive or negative saturation voltage. This occurs by the sensor 71 varying the voltage on the negative input of operational amplifier 66 above and below the voltage appearing on the positive input of operational amplifier 66 as determined by the voltage divider action of resistor 68 and 69. Positive feedback resistance 67, between the output of operational amplifier 66 and its positive input, is provided so that hysteresis is present to reduce oscillation at the output of amplifier 66. This resistance and the high gain of amplifier 66 lead to rapid switching of the output of amplifier 66 between its positive and negative saturation values.

The embodiments of the invention in which an exclusive property or right is claimed are defined as follows:

1. An electronic switching circuit for controlling transfer of electrical power from an alternating polarity electrical power supply means to a load means, said switching circuit comprising:

a first transfer control field-effect device provided in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and a first transfer control field-effect device gate region capable of affecting upon electrical energization thereof, any current flow occurring through said first transfer control field-effect device channel region as a result of electrical energization of said first transfer control field-effect device first and second terminating regions;

a first parasitic bypass means having first and second terminating regions and having a control region therein by which said first parasitic bypass means is capable of being directed to effectively provide a conductive path of a selected conductivity between said first parasitic bypass means first and second terminating regions, said first parasitic bypass means first terminating region being electrically connected to one of said first transfer control field-effect device first and second terminating regions, and said first parasitic bypass means second terminating region being electrically connected to said first substrate; and a second parasitic bypass means having first and second terminating regions and having a control region therein by which said second parasitic bypass means is capable of being directed to effectively provide a conductive path of a selected conductivity between said second parasitic bypass first and second terminating regions, said second parasitic bypass means first terminating region being electrically connected to that one of said first transfer control field-effect device first and second terminating regions opposite that to which said first parasitic bypass means is electrically connected, as aforesaid, and said second parasitic bypass means second terminating region being electrically connected to said first substrate, whereby shunting can be provided between said first substrate and said first transfer control field-effect device first and second terminating regions.

2. The apparatus of claim 1 wherein said circuit further comprises:

said first transfer control field-effect device being effectively a field-effect transistor with said first transfer control field-effect device first and second terminating regions being source and drain regions therein; and said first parasitic bypass means being a field-effect transistor with said first parasitic bypass means first and second terminating regions being source and drain regions therein separated by a channel region located, at least in part, in a first selected region of a second substrate, and with said first parasitic bypass means control region being a gate region which is electrically connected to that one of said first transfer control field-effect device first and second terminating regions opposite that to which said first parasitic bypass means first terminating region is connected, as aforesaid, where said first and second substrates are in common.

3. The apparatus of claim 1 wherein there is provided a third parasitic bypass means having first and second terminating regions between which said third parasitic bypass means is capable of effectively providing a conductive path, said third parasitic bypass means first terminating region being electrically connected to any one of said first substrate and said first transfer control field-effect device first and second terminating regions, and said third parasitic bypass means second terminating region being electrically connected to said first transfer control field-effect device gate region.

4. The apparatus of claim 1 wherein said circuit further comprises:

said first transfer control field-effect device being effectively a field-effect transistor with said first transfer control field-effect device first and second terminating regions being souce and drain regions therein;

said first parasitic bypass means being a field-effect transistor with said first parasitic bypass means first and second terminating regions being source and drain regions therein separated by a channel region located, at least in part, in a first selected region of a second substrate, and with said first parasitic bypass means control region being a gate region which is electrically connected to said second parasitic bypass means first terminating region; and said second parasitic bypass means being a field-effect transistor with said second parasitic bypass means first and second terminating regions being source and drain regions therein separated by a channel region located, at least in part, in a first selected region of a third substrate, and with said second parasitic bypass means control region being a gate region which is electrically connected to said first bypass means first terminating region.

5. The apparatus of claim 1 wherein said circuit further comprises:

an energy storage means having first and second polarity regions between which said energy storage means is capable of providing electrical energy storage, said energy storage means first polarity region being electrically connected to said first substrate;

a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to one of said first and second terminal means; and a control switch means capable, upon activation, of electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

6. The apparatus of claim 1 wherein said circuit further comprises:

an anergy storage means having first and second polarity regions between which said energy storage means is capable of providing electrical energy storage, said energy storage means first polarity region being electrically connected to said first substrate;

a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to a third terminal means adapted for electrical connection to both said alternating polarity electrical power supply means and said load means; and a control switch means capable, upon activation, of electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

7. The apparatus of claim 1 wherein there is provided first and second signal controlled directing means, each of said first and second signal controlled directing means having first and second terminating regions therein and each having a control region therein by which each of said first and second directing means is capable of being directed to effectively provide a conductive path of a selected conductivity between its first and second terminating regions, said first signal controlled directing means second terminating region being electrically connected (i) to said second signal controlled directing means first terminating region, and (ii) to said first transfer control field-effect device gate region.

8. The apparatus of claim 3 wherein there is provided first and second signal controlled field-effect transistors, each of said first and second signal controlled field-effect transistors having first and second terminating regions seprated by channel regions and each having a gate region, said first signal controlled field-effect transistor second terminating region being electrically connected (i) to said second signal controlled field-effect transistor first terminating region, (ii) to said first transfer control field-effect device gate region, and (iii) to said third parasitic bypass means second terminating region.

9. The apparatus of claim 3 wherein there is provided first and second control field-effect transistors, each of said first and second control field-effect transistors having first and second terminating regions separated by channel regions and each having a gate region; and wherein there is provided a control switch means capable, upon activation, of electrically connecting both said first transfer control field-effect device gate region and said third parasitic bypass means second terminating region to a selected one of (i) said first control field-effect transistor second terminating region, and (ii) said second control field-effect transistor first terminating region, whereby electrical power can be selectively transferred from said alternating polarity power supply means to said load means in correspondence with said selection of electrical connection for both said first transfer control field-effect device gate region and said third parasitic bypass means second terminating region.

10. The apparatus of claim 3 wherein said circuit further comprises:

said first transfer control field-effect device being effectively a field-effect transistor with said first transfer control field-effect device first and second terminating regions being source and drain regions therein;

said first parasitic bypass means being a field-effect transistor with said first parasitic bypass means first and second terminating regions being source and drain regions therein separated by a channel region located, at least in part, in a first selected region of a second substrate, and with said first parasitic bypass means control region being a gate region which is electrically connected to said second parasitic bypass means first terminating region;

said second parasitic bypass means being a field-effect transistor with said second parasitic bypass means first and second terminating regions being source and drain regions therein separated by a channel region located, at least in part, in a first selected region of a third substrate, and with said second parasitic bypass means control region being a gate region which is electrically connected to said first parasitic bypass means first terminating region, and said third parasitic bypass means being a field-effect transistor with said third parasitic bypass means first and second terminating regions being source and drain regions therein separated by a channel region located, at least in part, in a first selected region of a fourth substrate and having a gate region which is electrically connected to said first transfer control field-effect device.

11. The apparatus of claim 4 wherein said circuit further comprises:

said first transfer control field-effect device being effectively an enhancement mode, metal-oxide-semiconductor, field-effect transistor (MOSFET) with said first transfer control field-effect device gate region being separated from said first selected region of said first substrate by an insulating layer;

said first parasitic bypass means being an enhancement mode, metal-oxide-semiconductor, field-effect transistor (MOSFET) with said first parasitic bypass means gate region being separated from said first selected region of said second substrate by an insulating layer; and said second parasitic bypass means being an enhancement mode, metal-oxide-semiconductor, field-effect transistor (MOSFET) with said second parasitic bypass means gate region being separated from said first selected region of said third substrate by an insulating layer, where said first, second and third substrates are in common.

12. The apparatus of claim 4 wherein said first transfer control field-effect device is effectively a depletion mode field-effect transistor.

13. The apparatus of claim 5 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region being electrically connected to that one of said first and second terminal means opposite that to which said first unidirectional current conducting means second terminating region is connected as aforesaid.

14. The apparatus of claim 5 wherein said first circuit portion arrangement comprises at least a portion of said load means being electrically connected to a third terminal means adapted for electrical connection to said alternating polarity electrical power supply means, and wherein one of said first and second terminal means is electrically connected to said portion of said load means, and wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region and said second unidirectional current conducting means second terminating region being electrically connected to said third terminal means.

15. The apparatus of claim 5 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transfer control field-effect device gate region, said first signal controlled field-effect transistor first terminating region being electrically connected to said first substrate, and said second signal controlled field-effect transistor second terminating region being electrically connected to said first unidirectional current means first terminating region.

16. The apparatus of claim 5 wherein said energy storage means is a capacitance means.

17. The apparatus of claim 5 wherein said energy storage means is a means through which at least some electrical power can be supplied to said switching circuit from an electrical power source other than said alternating polarity electrical power supply means upon electrical energization of said energy storage means by said other source.

18. The apparatus of claim 6 wherein said switch control means comprises first and second signal controlled field-effect transistors, each of said first and second signal controlled field-effect transistors having first and second terminating regions separated by channel regions and each having a gate region, said first signal controlled field-effect transistor second terminating region being electrically connected to both said second signal controlled field-effect transistor first terminating region and to said first transistor control field-effect device gate region, said first signal control field effect transistor first terminating region being electrically connected to said first substrate and said second signal controlled field-effect transistor second terminating region being electrically connected to said first unidirectional current means first terminating region.

19. The apparatus of claim 6 wherein said energy storage means is a capacitance means.

20. The apparatus of claim 6 wherein said energy storage means is a means through which at least some electrical power can be supplied to said switching circuit from an electrical power source other than said alternating polarity electrical power supply means upon electrical energization of said energy storage means by said other source.

21. The apparatus of claim 7 wherein said circuit further comprises an energy storage means having first and second polarity regions between which said energy storage means is capable of providing electrical energy storage, said energy storage means first polarity region being electrically connected to said first substrate.

22. The apparatus of claim 7 wherein said circuit further comprises a first unidirectional current conducting means having therein first and second terminating regions between which an asymmetrical current conducting capability is exhibited, said first unidirectional current conducting means first terminating region being electrically connected to said first signal controlled directing means first terminating region, and said first unidirectional current conducting means second terminating region being electrically connected to a third terminal means adapted for electrical connection to both said alternating polarity electrical power supply means and said load means.

23. The apparatus of claim 7 wherein said circuit further comprises a first unidirectional current conducting means having therein first and second terminating regions between which an asymmetrical current conducting capability is exhibited; said first unidirectional current conducting means first terminating region being electrically connected to one of said first and second terminal means, and said first unidirectional current conducting means second terminating region being electrically connected to said first signal controlled directing means first terminating region.

24. The apparatus of claim 7 wherein said circuit further comprises:
- a third signal controlled directing means having first and second terminating regions therein and having a control region therein by which said third signal controlled directing means is capable of being directed to effectively provide a conductive path of a selected conductivity between said third signal controlled directing means first and second terminating regions;
- a circuit load having a first and second terminating region between which said circuit load is capable of effectively providing a conductive path, said circuit load first terminating region being electrically connected to said first signal controlled directing means first terminating region, said circuit load second terminating region being electrically connected to both said third signal controlled directing means first terminating region and to said first signal controlled directed means control region.

25. The apparatus of claim 8 wherein said circuit further comprises:
- a third signal controlled field-effect transistor having first and second terminating regions separated by a channel region, and having a gate region;
- a circuit load having first and second terminating regions between which said circuit load is capable of effectively providing a conductive path; and
- a first unidirectional current conducting means having therein first and second terminating regions between which an asymmetrical current conducting capability is exhibited, said first unidirectional current conducting means first terminating region being electrically connected to both said circuit load first terminating region and said first signal controlled field-effect transistor first terminating region, and with said circuit load second terminating region being electrically connected to both said first signal controlled field-effect transistor gate region and to said third signal controlled field-effect transistor first terminating region, said first unidirectional current conducting means second terminating region being electrically connected to a third terminal means adapted for electrical connection to both said alternating polarity electrical power supply means and said load means with said second signal controlled field-effect transistor second terminating region being electrically connected to one of said first and second terminal means.

26. The apparatus of claim 8 wherein said circuit further comprises:
- an energy storage means having first and second polarity regions between which said energy storage means is capable of providing electrical energy storage, said energy storage means first polarity region being electrically connected to said first substrate; and
- a first unidirectional current conducting means having therein first and second terminating regions between which an asymmetrical current conducting capability is exhibited, said first unidirectional current conducting means first terminating region being electrically connected to said energy storage means second polarity region, said first unidirectional current conducting means second terminating region being electrically connected to one of said first and second terminal means, said first signal controlled field-effect transistor first terminating region being electrically connected to one of said energy storage means first and second polarity regions, and said second signal controlled field-effect transistor second terminating region being electrically connected to that one of said energy storage means first and second polarity regions opposite that to which said first signal controlled field-effect transistor first terminating region is connected as aforesaid.

27. The apparatus of claim 8 wherein said circuit further comprises:
- an energy storage means having first and second polarity regions between which said energy storage means is capable of providing electrical energy storage, said energy storage means first polarity region being electrically connected to said first substrate; and
- a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to a third terminal means adapted for electrical connection to both said alternating polarity electrical power supply means and said load means, said first signal controlled field-effect transistor first terminating region being electrically connected to one of said energy storage means first and second polarity regions, and said second signal controlled field-effect transistor second terminating region being electrically connected to that one of said energy storage means first and second polarity regions opposite that to which said first signal control field-effect transistor first terminating region is connected as aforesaid.

28. The apparatus of claim 8 wherein said circuit further comprises:

said first transfer control field-effect device being effectively a field-effect transistor with said first transfer control field-effect device first and second terminating regions being source and drain regions therein;

said first parasitic bypass means being a field-effect transistor with said first parasitic bypass means first and second terminating regions being source and drain regions therein separated by a channel region located, at least in part, in a first selected region of a second substrate, and with said first parasitic bypass means control region being a gate region which is electrically connected to said second parasitic bypass means first terminating region;

said second parasitic bypass means being a field-effect transistor with said second parasitic bypass means first and second terminating regions being source and drain regions therein separated by a channel region located, at least in part, in a first selected region of a third substrate, and with said second parasitic bypass means control region being a gate region which is electrically connected to said first parasitic bypass means first terminating region;

said third parasitic bypass means being a field-effect transistor with said third parasitic bypass means first and second terminating regions being source and drain regions therein separated by a channel region located, at least in part, in a first selected region of a fourth substrate, and having a gate region which is electrically connected to said first transfer control field-effect device;

said first signal controlled field-effect transistor channel region being located, at least in part, in a first selected region of a fifth substrate; and said second signal controlled field-effect transistor channel region being located, at least in part, in a first selected region of a sixth substrate.

29. The apparatus of claim 9 wherein said first control field-effect transistor gate region, said first control field-effect transistor first terminating region, and said second control field-effect transistor gate region are each electrically connected to a third terminal means adapted for electrical connection to both said alternating polarity electrical power supply means and said load means, and wherein said second control field-effect transistor second terminating region is electrically connected to one of said first and second terminal means.

30. The apparatus of claim 10 wherein said circuit further comprises:

said first transfer control field-effect device being effectively an enhancement mode, metal-oxide-semiconductor, field-effect transistor (MOSFET) with said first transfer control field-effect device gate region being separated from said first selected region of said first substrate by an insulating layer;

said first parasitic bypass means being an enhancement mode, metal-oxide-semiconductor, field-effect transistor (MOSFET) with said first parasitic bypass means gate region being separated from said first selected region of said second substrate by an insulating layer;

said second parasitic bypass means being an enhancement mode, metal-oxide-semiconductor, field-effect transistor (MOSFET) with said second parasitic bypass means gate region being separated from said first selected region in a said third substrate by an insulating layer; and said third parasitic bypass means being an enhancement mode, metal-oxide-semiconductor, field-effect transistor (MOSFET) with said third parasitic bypass means gate region being separated from said first selected region of said fourth substrate by an insulating layer, where said first, second, third, and fourth substrates are in common.

31. The apparatus of claim 10 wherein said first transfer control field-effect device is effectively a depletion mode field-effect transistor.

32. The apparatus of claim 15 wherein said circuit further comprises:

a third signal controlled field-effect transistor having first and second terminating regions separated by a channel region, and having a gate region;

a circuit load having a first and second terminating region between which said circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and an input signal processing circuit, operable with a constant polarity power supply, having first and second power connection regions and having a first signal output region, said first power connection region being electrically connected to said first signal controlled field-effect transistor first terminating region and said second power connection region being electrically connected to said second signal controlled field-effect transistor second terminating region, said output region being electrically connected to both said second and third signal controlled field-effect transistor gate regions.

33. The apparatus of claim 18 wherein said circuit further comprises:

said third signal controlled field-effect transistor having first and second terminating regions separated by a channel region, and having a gate region;

a circuit load having a first and second terminating region between which said first circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and an input signal processing circuit, operable with a constant polarity power supply, having first and second power connection regions and having a first signal output region, said first power connection region being electrically connected to said first signal controlled field-effect transistor first terminating region and said second power connection region being electrically connected to said second signal controlled field-effect transistor second terminating region, said output region being electrically connected to both said second and third signal controlled field-effect transistor gate regions.

34. The apparatus of claim 25 wherein said circuit further comprises:

said third parasitic bypass means being a field-effect transistor with said third parasitic bypass means first and second terminating regions being source and drain regions therein separated by a channel region, and having a gate region which is electrically connected to said first transfer control field-effect device; and a second unidirectional current conducting means having therein first and second terminating regions between which an asymmetrical current conducting capability is exhibited, said second unidirectional current conducting means first terminating region being electrically connected to one of said first and second terminal means, and said second unidirectional current conducting means second terminating region being electrically connected to said third signal controlled field-effect transistor second terminating region.

35. The apparatus of claim 25 wherein said circuit further comprises:
a second unidirectional current conducting means having therein first and second terminating regions between which an asymmetrical current conducting capability is exhibited; said second unidirectional current conducting means first terminating region being electrically connected to one of said first and second terminal means; and
said third parasitic bypass means being a field-effect transistor with said third parasitic bypass means first and second terminating region being source and drain region therein separated by a channel region, and having a gate region which is electrically connected to said second unidirectional current conducting means second terminating region and to said second signal controlled field-effect transistor second terminating region.

36. The apparatus of claim 25 wherein there is provided an input signal processing circuit, operable with a constant polarity power supply, having first and second power connection regions and having a first signal output region, said first power connection region being electrically connected to said first unidirectional current conducting means first terminating region and said second power connection region being electrically connected to said third signal controlled field-effect transistor second terminating region, said output region being electrically connected to both said second and third signal controlled field-effect transistor gate regions.

37. The apparatus of claim 26 wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region, and said second unidirectional current conducting means second terminating region being electrically connected to that one of said first and second terminal means opposite that to which said first unidirectional current conducting means second terminating region is connected as aforesaid.

38. The apparatus of claim 26 wherein said first circuit portion arrangement comprises at least a portion of said load means being electrically connected to a third terminal means adapted for electrical connection to said alternating polarity power supply means, and wherein one of said first and second terminal means is electrically connected to said portion of said load means, and wherein a second unidirectional current conducting means is provided having therein first and second terminating regions between which an asymmetrical current conducting capability is exhibited, said second unidirectional current conducting means first terminating region being electrically connected to said first unidirectional current conducting means first terminating region and said second unidirectional current conducting means second terminating region being electrically connected to said third terminal means.

39. The apparatus of claim 26 wherein said energy storage means is a capacitance means.

40. The apparatus of claim 26 wherein said energy storage means is a means through which at least some electrical power can be supplied to said switching circuit from an electrical power source other than said alternating polarity electrical power supply means upon electrical energization of said energy storage means by said other source.

41. The apparatus of claim 26 wherein said circuit further comprises:
a third signal controlled field-effect transistor having first and second terminating regions separated by a channel region, and having a gate region;
a circuit load having a first and second terminating region between which said first circuit load is capable of effectively providing a conductive path, said circuit load first terminating region being electrically connected to said first signal controlled field-effect transistor first terminating region, said circuit load second terminating region being electrically connected to both said third signal controlled field-effect transistor first terminating region and to said first signal controlled field-effect transistor gate region; and
an input signal processing circuit, operable with a constant polarity power supply, having first and second power connection regions and having a first signal output region, said first power connection region being electrically connected to said first signal controlled field-effect transistor first terminating region and said second power connection region being electrically connected to said second signal controlled field-effect transistor second terminating region, said output region being electrically connected to both said second and third signal controlled field-effect transistor gate regions.

42. The apparatus of claim 27 wherein said energy storage means is a capacitance means.

43. The apparatus of claim 27 wherein said energy storage means is a means through which at least some electrical power can be supplied to said switching circuit from an electrical power source other than said alternating polarity electrical power supply means upon electrical energization of said energy storage means by said other source.

44. The apparatus of claim 27 wherein said circuit further comprises:
a third signal controlled field-effect transistor having first and second terminating regions separated by a channel region, and having a gate region;
a circuit load having a first and second terminating region between which said first circuit load is capable of effectively providing a conductive path, said circuit load first terminating region being electrically connected to said first signal controlled field-effect transistor first terminating region, and said circuit load second terminating region being electrically connected to both said third signal controlled field-effect transistor first terminating region and to said first signal controlled field-effect transistor gate region; and an input signal processing circuit, operable with a constant polarity power supply, having first and second power connection regions and having a first signal output region, said first power connection region being electrically connected to said first signal controlled field-effect transistor first terminating region and said second power connection region being electrically connected to said second signal controlled field-effect transistor second terminating region, said output region being electrically connected to both said second and third signal controlled field-effect transistor gate regions.

45. The apparatus of claim 28 wherein said circuit further comprises:

said first transfer control field-effect device being effectively an enhancement mode, metal-oxide-semiconductor field-effect transistor (MOSFET) with said first transfer control field-effect device gate region being separated from said first selected region of said first substrate by an insulating layer;

said first parasitic bypass means being an enhancement mode, metal-oxide-semiconductor, field-effect transistor (MOSFET) with said first parasitic bypass means gate region being separated from said first selected region of said second substrate by an insulating layer;

said second parasitic bypass means being an enhancement mode, metal-oxide-semiconductor, field-effect transistor (MOSFET) with said second parasitic bypass means gate region being separated from said first selected region of said third substrate by an insulating layer;

said third parasitic bypass means being an enhancement mode, metal-oxide-semiconductor, field-effect transistor (MOSFET) with said parasitic bypass means gate region being separated from said first selected region of said fourth substrate by an insulating layer;

said first signal controlled field-effect transistor being an enhancement mode, metal-oxide-semiconductor, field-effect transistor (MOSFET) with said first signal controlled field-effect transistor gate region being separated from said first selected region of said fifth substrate by an insulating layer; and said second signal controlled field-effect transistor being an enhancement mode, metal-oxide-semiconductor, field-effect transistor (MOSFET) with said second signal controlled field-effect transistor gate region being separated from said first selected region of said sixth substrate by an insulating layer, where said first, second, third, fourth, fifth, and sixth substrates are in common.

46. The apparatus of claim 28 wherein said first transfer control field-effect device is effectively a depletion mode field-effect transistor.

47. The apparatus of claim 32 wherein said input signal processing circuit includes an AND logic gate having an output electrically connected to said first signal output region, and having a plurality of inputs including a signal input and an input having a voltage detector circuit connected thereto, said voltage detector circuit being capable both (i) of being operated by, and (ii) of detecting voltages occurring across said storage means and being electrically connected to said energy storage means in a manner to permit exercise of these capabilities.

48. The apparatus of claim 33 wherein said input signal processing circuit includes an AND logic gate having an output electrically connected to said first signal output region, and having a plurality of the inputs including a signal input and an input having a voltage detector circuit connected thereto, said voltage detector circuit being capable both (i) of being operated by, and (ii) of detecting voltages occurring across said storage means and being electrically connected to said energy storage means in a manner to permit exercise of these capabilities.

49. The apparatus of claim 41 wherein said input signal processing circuit includes an AND logic gate having an output electrically connected to said first signal output region, and having a plurality of the inputs including a signal input and an input having a voltage detector circuit connected thereto, said voltage detector circuit being capable both (i) of being operated by, and (ii) of detecting voltages occurring across said storage means and being electrically connected to said energy storage means in a manner to permit exercise of these capabilities.

50. The apparatus of claim 44 wherein said input signal processing circuit includes an AND logic gate having an output electrically connected to said first signal output region, and having a plurality of the inputs including a signal input and an input having a voltage detector circuit connected thereto, said voltage detector circuit being capable both (i) of being operated by, and (ii) of detecting voltages occurring across said storage means and being electrically connected to said energy storage means in a manner to permit exercise of these capabilities.

51. An electronic switching circuit for controlling transfer of electrical power from an alternating polarity electrical power supply means to a load means, said switching circuit comprising:

a first transfer control field-effect device provided in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating regions being electrically connected to a second terminal means adapted for electrical connection to said first circuit portion arrangement; and a first transfer control field-effect device gate region capable of affecting upon electrical energization thereof, any current flow occurring through said first transfer control field-effect device channel region as a result of electrical energization of said first transfer control field-effect device first and second terminating regions;

a first parasitic bypass means having first and second terminating regions and having a control region therein by which said first parasitic bypass means is capable of being directed to effectively provide a conductive path of a selected conductivity between said first parasitic bypass means first and second terminating regions, said first parasitic bypass means first terminating region being electrically connected to any one of said first substrate and said first transfer control field-effect device first and second terminating regions, and said first parasitic bypass means second terminating region being electrically connected to said first transfer control field-effect device gate region;

a second parasitic bypass means having first and second terminating regions between which said second parasitic bypass means is capable of effectively providing a conductive path, said second parasitic bypass means first terminating region being electrically connected to one of said first transfer control field-effect device first and second terminating regions, and said second parasitic bypass means second terminating region being electrically connected to said first substrate; and a third parasitic bypass means having first and second terminating regions between which said third parasitic bypass means is capable of effectively providing a conductive path, said third parasitic bypass means first terminating region being electrically connected to that one of said first transfer control field-effect device first and second terminating regions opposite that to which said second parasitic bypass means is connected, as aforesaid, and said third parasitic bypass means second terminating region being electrically connected to said first substrate, whereby shunting can be provided between said first substrate, said first transfer control field-effect device gate region, and said first transfer control field-effect device first and second terminating regions.

52. The apparatus of claim 51 wherein said circuit further comprises:
said first transfer control field-effect device being effectively a field-effect transistor with said first transfer control field-effect device first and second terminating regions being source and drain regions therein;
said second parasitic bypass means being a passive resistance means; and
said third parasitic bypass means being a passive resistance means.

53. An electronic switching circuit for controlling transfer of electrical power from an alternating polarity electrical power supply means to a load means, said switching circuit comprising:
a first transfer control field-effect device in and on a first substrate, said first transfer control field-effect device comprising:
a first transfer control field-effect device channel region located at least in part in a first selected region of said first substrate;
first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and
a first transfer control field-effect device gate region capable of effecting upon electrical energization thereof, any current flow occurring through said first transfer control field-effect device channel region as a result of electrical energization of said first transfer control field-effect device first and second terminating region;

a first parasitic bypass means having first and second terminating regions between which said first parasitic bypass means is capable of effectively providing a conductive path, said first parasitic bypass means first terminating region being electrically connected to one of said first transfer control field-effect device first and second terminating regions, and said first parasitic bypass means second terminating region being electrically connected to said first substrate;

a second parasitic bypass means having first and second terminating regions between which said second parasitic bypass means is capable of effectively providing a conductive path, said second parasitic bypass means first terminating region being electrically connected to that one of said first transfer control field-effect device first and second terminating regions opposite that to which said first parasitic bypass means is connected, as aforesaid, and said second parasitic bypass means second terminating region being electrically connected to said first substrate;

an energy storage means having first and second polarity regions between which said energy storage means is capable of providing electrical energy storage, said energy storage means first polarity region being electrically connected to said first substrate;

a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to one of said first and second terminal means; and a control switch means capable, upon activation, of electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

54. The apparatus of claim 53 wherein said switch control means comprises first and second signal controlled directing means, each of said first and second signal controlled directing means having first and second terminating regions therein and each having a control region therein by which each of said first and second signal controlled directing means is capable of being directed to effectively provide a conductive path of a selected conductivity between its first and second terminating regions, said first signal controlled directing means second terminating region being electrically connected to both said second signal controlled directing means first terminating region and to said first transfer control field-effect device gate region, said first signal controlled directing means first terminating region being electrically connected to said first substrate, and said second signal controlled directing means second terminating region being electrically connected to said first unidirectional current conducting means first terminating region.

55. An electronic switching circuit for controlling transfer of electrical power from an alternating polarity electrical power supply means to a load means, said switching circuit comprising:
- a first transfer control field-effect device in and on a first substrate, said first transfer control field-effect device comprising:
  - a first transfer control field-effect device channel region located at least in part in a first selected region of said first substrate;
  - first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and
  - a first transfer control field-effect device gate region capable of effecting upon electrical energization thereof, any current flow occurring through said first transfer control field-effect device channel region as a result of electrical energization of said first transfer control field-effect device first and second terminating region;
- a first parasitic bypass means having first and second terminating regions between which said first parasitic bypass means is capable of effectively providing a conductive path, said first parasitic bypass means first terminating region being electrically connected to one of said first transfer control field-effect device first and second terminating region, and said first parasitic bypass means second terminating region being electrically connected to said first substrate;
- a second parasitic bypass means having first and second terminating regions between which said second parasitic bypass means is capable of effectively providing a conductive path, said second parasitic bypass means first terminating region being electrically connected to that one of said first transfer control field-effect device first and second terminating regions opposite that to which said first parasitic bypass means is connected, as aforesaid, and said second parasitic bypass means second terminating region being electrically connected to said first substrate;
- an energy storage means having first and second polarity regions between which said energy storage means is capable of providing electrical energy storage, said energy storage means first polarity region being electrically connected to said first substrate;
- a first unidirectional current conducting means having therein first and second terminating regions between which an asymmetrical current conducting capability is exhibited, said first unidirectional current conducting means first terminating region being electrically connected to said energy storage means second polarity region, and said first unidirectional current conducting means second terminating region being electrically connected to a third terminal means adapted for electrical connection to both said alternating polarity electrical power supply means and said load means; and
- a control switch means capable, upon activation, of electrically connecting said first transfer control field-effect device gate region to a selected one of (i) said first substrate, and (ii) said first unidirectional current conducting means first terminating region, whereby electrical power can be selectively transferred from said alternating polarity electrical power supply means to said load means in correspondence with said selection of electrical connection for said first transfer control field-effect device gate region.

56. The apparatus of claim 55 wherein said switch control means comprises first and second signal controlled directing means, each of said first and second signal controlled directing means having first and second terminating regions therein and each having a control region therein by which each of said first and second signal controlled directing means is capable of being directed to effectively provide a conductive path of a selected conductivity between its first and second terminating regions, said first signal controlled directing means second terminating region being electrically connected to both said second signal controlled directing means first terminating region and to said first transfer control field-effect device gate region, said first signal controlled directing means first terminating region being electrically connected to said first substrate and said second signal controlled directing means second terminating region being electrically connected to said first unidirectional current conducting means first terminating region.

57. An electronic switching circuit for controlling transfer of electrical power from an alternating polarity electrical power supply means to a load means, said switching circuit comprising:

a first transfer control field-effect device in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and a first transfer control field-effect device gate region capable of effecting upon electrical energization thereof, any current flow occurring through said first transfer control field-effect device channel region as a result of electrical energization of said first transfer control field-effect device first and second terminating region;

a first parasitic bypass means having first and second terminating regions between which said first parasitic bypass means is capable of effectively providing a conductive path said first parasitic bypass means first terminating region being electrically connected to one of said first transfer control field-effect device first and second terminating region, and said first parasitic bypass means second terminating region being electrically connected to said first substrate;

a second parasitic bypass means having first and second terminating regions between which said second parasitic bypass means is capable of effectively providing a conductive path, said second parasitic bypass means first terminating region being electrically connected to that one of said first transfer control field-effect device first and second terminating regions opposite that to which said first parasitic bypass means is connected, as aforesaid, and said second parasitic bypass means second terminating region being electrically connected to said first substrate;

first and second means each of said first and second control means having first and second terminating regions therein and each having a control region therein by which each of said first and second control means is capable of being directed to effectively provide a conductive path of a selected conductivity between its first and second terminating regions; and a control switch means capable, upon activation, of electrically connecting said first transfer control field-effect device gate region to a selected one of (i) said first control means second terminating region, and (ii) said second control means first terminating region, whereby electrical power can be selectively transferred from said alternating polarity power supply means to said load means in correspondence with said selection of electrical connection for said first transfer control field-effect device gate region.

58. The apparatus of claim 57 wherein said first control means control region, said first control means first terminating region, and said second control means control region are each electrically connected to a third terminal means adapted for electrical connection to both said alternating polarity electrical power supply means and said load means, and wherein said second control means second terminating region is electrically connected to one of said first and second terminal means.

59. An electronic switching circuit for controlling transfer of electrical power from an alternating polarity electrical power supply means to a load means, said switching circuit comprising:

a first transfer control field-effect device in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and a first transfer control field-effect device gate region capable of effecting upon electrical energization thereof, any current flow occurring through said first transfer control field-effect device channel region as a result of electrical energization of said first transfer control field-effect device first and second terminating region;

a first parasitic bypass means having first and second terminating regions between which said first parasitic bypass means is capable of effectively providing a conductive path, said first parasitic bypass means first terminating region being electrically connected to one of said first transfer control field-effect device first and second terminating region, and said first parasitic bypass means second terminating region being electrically connected to said first substrate;

a second parasitic bypass means having first and second terminating regions between which said second parasitic bypass means is capable of effectively providing a conductive path, said second parasitic bypass means first terminating region being electrically connected to that one of said first transfer control field-effect device first and second terminating regions opposite that to which said first parasitic bypass means is connected, as aforesaid, and said second parasitic bypass means second terminating region being electrically connected to said first substrate;

first, and second signal controlled directing means, each of said first and second signal controlled directing means having first and second terminating regions therein and each having a control region therein by which each of said first and second signal controlled directing means is capable of being directed to effectively provide a conductive path of a selected conductivity between its first and second terminating regions, said first signal controlled directing means second terminating region being electrically connected (i) to said second signal controlled directing means first terminating region, and (ii) to said first transfer controlled field-effect device gate region;

a first unidirectional current conducting means having therein first and second terminating regions between which asymmetrical current conducting capability is exhibited, said first unidirectional current conducting means first terminating region being electrically connected to said first signal controlled directing means first terminating region, said first unidirectional current conducting means second terminating region being electrically connected to a third terminal means adapted for electrical connection to both said alternating polarity electrical power supply means and said load means.

60. An electronic switching circuit for controlling transfer of electrical power from an alternating polarity electrical power supply means to a load means, said switching circuit comprising:

a first transfer control field-effect device in and on a first substrate, said first transfer control field-effect device comprising:

a first transfer control field-effect device channel region located at least in part in a first selected region of said first substrate;

first transfer control field-effect device first and second terminating regions, separated by said first transfer control field-effect device channel region, into which and out of which primary currents through said first field-effect device can, at least in part, pass upon electrical energization of said first transfer control field-effect device first and second terminating regions, said first field-effect device first terminating region being electrically connected to a first terminal means adapted for electrical connection to a first circuit portion arrangement which includes both said alternating polarity electrical power supply means and said load means, and said first field-effect device second terminating region being electrically connected to a second terminal means adapted for electrical connection to said first circuit portion arrangement; and a first transfer control field-effect device gate region capable of effecting upon electrical energization thereof, any current flow occurring through said first transfer control field-effect device channel region as a result of electrical energization of said first transfer control field-effect device first and second terminating region;

a first parasitic bypass means having first and second terminating regions between which said first parasitic bypass means is capable of effectively providing a conductive path, said first parasitic bypass means first terminating region being electrically connected to one of said first transfer control field-effect device first and second terminating region, and said first parasitic bypass means second terminating region being electrically connected to said first substrate;

a second parasitic bypass means having first and second terminating regions between which said second parasitic bypass means is capable of effectively providing a conductive path, said second parasitic bypass means first terminating region being electrically connected to that one of said first transfer control field-effect device first and second terminating regions opposite that to which said first parasitic bypass means is connected, as aforesaid, and said second parasitic bypass means second terminating region being electrically connected to said first substrate;

first and second signal controlled directing means, each of said first and second signal controlled directing means having first and second terminating regions therein and each having a control region therein by which each of said first and second signal controlled directing means is capable of being directed to effectively provide a conductive path of a selected conductivity between its first and second terminating regions, said first signal controlled directing means second terminating region being electrically connected (i) to said second signal controlled directing means first terminating region, and (ii) to said first transfer controlled field-effect device gate region;

a first unidirectional current conducting means having therein first and second terminating regions between which asymmetrical current conducting capability is exhibited, said first unidirectional current conducting means first terminating region being electrically connected to said first signal controlled directing means first terminating region, said first unidirectional current conducting means second terminating region being electrically connected to one of said first and second terminal means.

* * * * *